(12) United States Patent
Hayashi et al.

(10) Patent No.: US 7,541,839 B2
(45) Date of Patent: Jun. 2, 2009

(54) SEMICONDUCTOR DEVICE HAVING A PSEUDO POWER SUPPLY WIRING

(75) Inventors: Junichi Hayashi, Tokyo (JP); Hiromasa Noda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 27 days.

(21) Appl. No.: 11/878,209

(22) Filed: Jul. 23, 2007

(65) Prior Publication Data

US 2008/0169840 A1 Jul. 17, 2008

(30) Foreign Application Priority Data

Aug. 1, 2006 (JP) .............................. 2006-209778

(51) Int. Cl.
*H03K 19/094* (2006.01)
(52) U.S. Cl. .............................. 326/83; 326/27; 326/33; 326/121; 327/544
(58) Field of Classification Search .................. 326/81, 326/83, 93–95, 104, 112, 119, 121, 122
See application file for complete search history.

(56) References Cited

U.S. PATENT DOCUMENTS 6,169,419 B1 * 1/2001 De et al. ....................... 326/58
6,208,171 B1 * 3/2001 Kumagai et al. ............. 326/121
2002/0005732 A1 * 1/2002 Yokomizo ................... 324/769
2002/0079927 A1 * 6/2002 Katoh et al. .................. 326/86
2006/0267633 A1 * 11/2006 King ............................ 326/83
2007/0176673 A1 * 8/2007 Ito .............................. 327/544

FOREIGN PATENT DOCUMENTS

JP 2000-13215 1/2000
JP 2000-048568 2/2000

* cited by examiner

*Primary Examiner*—Vibol Tan
*Assistant Examiner*—Jany Tran
(74) *Attorney, Agent, or Firm*—Young & Thompson

(57) ABSTRACT

A semiconductor device including an AND-NOR composite gate of which AND unit is supplied with input signals IN and VDD and NOR unit is supplied with an inverted signal EB of an enable signal E, and an AND-NOR composite gate of which AND unit is supplied with an input signal INB and an enable signal E and NOR unit is supplied with VSS. These gates are inserted into a path to which the input signals IN and INB are supplied. Thereby, a symmetric property of a complimentary signal can be retained. Further, outputs of the AND-NOR composite gates are fixed irrespective of a logical level of the enable signal E. Thus, a sub-threshold current also is inhibited.

19 Claims, 19 Drawing Sheets

SEMICONDUCTOR DEVICE HAVING A PSEUDO POWER SUPPLY WIRING

TECHNICAL FIELD

The present invention relates to a semiconductor device having a pseudo power supply wiring for reducing power consumption in a standby state. More specifically, the present invention relates to a semiconductor device including a path that transmits a complementary input signal.

BACKGROUND OF THE INVENTION

In recent years, an operating voltage of a semiconductor device is gradually decreasing for the purposes of reducing consumption power, and at present, a very low voltage of as low as 1 bolt is sometimes used. When the operating voltage decreases, a threshold voltage of a transistor needs to be decreased. Thus, there occurs a problem in that a sub-threshold current of a transistor in an off state increases. To solve such a problem, a method of dividing a power supply wiring into a main power supply wiring and a pseudo power supply wiring is proposed in Japanese Patent Application Laid-open Nos. 2000-13215 and 2000-48568.

FIG. 15 is a circuit diagram of a general semiconductor device using a pseudo power supply wiring.

A circuit shown in FIG. 15 includes a circuit block 10 formed of 4-stage inverters 11 to 14. In the circuit block 10, a logic value is fixed in a standby state, and in this example, its input signal IN is fixed to a high level in the standby state. Needless to say, in an active state, a logical value of the input signal IN varies as needed.

In the circuit shown in FIG. 15, four power supply wirings, that is, a main power supply wiring VDD and a pseudo power supply wiring VDDZ to which a power supply potential is supplied; and a main power supply wiring VSS and a pseudo power supply wiring VSSZ to which a ground potential is supplied are arranged. Between the main power supply wiring VDD and the pseudo power supply wiring VDDZ, a P-channel MOS transistor 21 is arranged, and its gate electrode is supplied with a stand by signal ST. Between the main power supply wiring VSS and the pseudo power supply wiring VSSZ, an N-channel MOS transistor 22 is arranged, and its gate electrode is supplied with a signal obtained by inverting the standby signal ST by an inverter 23.

The standby signal ST becomes a high level when the circuit block 10 is rendered the standby state, and remains a low level when the circuit block 10 is in the active state. Thus, in the active state, the main power supply wiring VDD and the pseudo power supply wiring VDDZ are short-circuited via the transistor 21, and the main power supply wiring VSS and the pseudo power supply wiring VSSZ are short-circuited via the transistor 22. On the other hand, in the standby state, both the transistors 21 and 22 are kept in an off state. Thus, the pseudo power supply wirings VDDZ and VSSZ are disconnected from the main power supply wirings VDD and VSS, respectively, and as a result, nearly no power supply potential is supplied.

Out of the four inverters 11 to 14 included in the circuit block 10, the first-stage inverter 11 and the third-stage inverter 13 are connected between the pseudo power supply wiring VDDZ and the main power supply wiring VSS, and the second-stage inverter 12 and the fourth-stage inverter 14 are connected between the main power supply wiring VDD and the pseudo power supply wiring VSSZ. As described above, in the active state, the main power supply wiring VDD and the pseudo power supply wiring VDDZ are short-circuited, and the main power supply wiring VSS and the pseudo power supply wiring VSSZ are short-circuited. Thus, a power supply voltage is correctly applied to both power supply terminals of all the inverters 11 to 14. As a result, the circuit block 10 can operate correctly, and an output signal OUT of the circuit block 10 is rendered a correct value according to a logical value of the input signal IN.

On the contrary, in the standby state, the pseudo power supply wiring VDDZ is disconnected from the main power supply wiring VDD, and the pseudo power supply wiring VSSZ is disconnected from the main power supply wiring VSS. Thus, sources of P-channel MOS transistors $11p$ and $13p$ included in the first-stage inverter 11 and the third-stage inverter 13 are supplied with nearly no power supply potential, and sources of N-channel MOS transistors $12n$ and $14n$ included in the second-stage inverter 12 and the fourth-stage inverter 14 are supplied with nearly no power supply potential.

However, in the standby state, the input signal IN is fixed to the high level. The transistors rendered conducting in the respective inverters 11 to 14 are fixed to an N-channel MOS transistor $11n$, a P-channel MOS transistor $12p$, an N-channel MOS transistor $13n$, and a P-channel MOS transistor $14p$ shown in FIG. 15, respectively. Sources of these transistors are connected to the main power supply wiring VDD or the main power supply wiring VSS, and thus, the logic value in the standby state is kept correctly.

On the other hand, sources of the P-channel MOS transistors $11p$ and $13p$ rendered non-conducting in the standby state are connected to the pseudo power supply wiring VDDZ disconnected from the main power supply wiring VDD. As a result, nearly no sub-threshold current is passed. Likewise, sources of the N-channel MOS transistors $12n$ and $14n$ rendered non-conducting in the standby state are connected to the pseudo power supply wiring VSSZ disconnected from the main power supply wiring VSS. As a result, nearly no sub-threshold current is passed. Thereby, it becomes possible to reduce the power consumption in the standby state of the circuit block 10.

FIG. 16 is a circuit diagram for explaining a method of connecting with the pseudo power supply wiring when the input signal is complementary.

As shown in FIG. 16, when complementary input signals IN and INB are used, it is possible that circuit configurations of inverters 31, 32, 33, 34, . . . through which the input signal IN rendered the high level in the standby state passes and those of inverters 41, 42, 43, 44, . . . through which the input signal INB rendered the low level in the standby state passes are identical, and with this state, connection relationships to the main power supply wiring and the pseudo power supply wiring are inverted.

Specifically, regarding the inverters 31, 32, 33, 34, . . . through which the input signal IN passes, it is possible that the inverters 31, 33, . . . at the odd-numbered stages (a first stage, a third stage, . . . ) are connected between the pseudo power supply wiring VDDZ and the main power supply wiring VSS, and the inverters 32, 34, . . . at even-numbered stages (a second stage, a fourth stage, . . . ) are connected between the main power supply wiring VDD and the pseudo power supply wiring VSSZ. On the other hand, regarding the inverters 41, 42, 43, 44, . . . through which the input signal INB passes, it is possible that the inverters 41, 43, . . . at the odd-numbered stages (a first stage, a third stage, . . . ) are connected between the main power supply wiring VDD and the pseudo power supply wiring VSSZ, and the inverters 42, 44, . . . at even-numbered stages (a second stage, a fourth stage, . . . ) are connected between the pseudo power supply wiring VDDZ and the main power supply wiring VSS.

Thereby, in both the inverters 31, 32, 33, 34, through which the input signal IN passes and the inverters 41, 42, 43, 44, ... through which the input signal INB passes, its transistors brought into an off state in the standby state are connected to the pseudo power supply wiring. Thus, it becomes possible to reduce the sub-threshold current.

However, in some products, paths to which the complementary input signals IN and INB are supplied are commonly supplied with an enable signal in some cases. For example, in a DRAM (Dynamic Random Access Memory), there are cases where adopted is a configuration such that when a fuse is cut at the time of production to fix the enable signal to one logical level, a data input/output width is 16 bits, for example, and when the fuse remains uncut to fix the enable signal to the other logical level, the data input/output width is 8 bits, for example. In such case, a common enable signal is supplied to the both paths to which the complementary input signals IN and INB are supplied, and thus, this leads to a case where the sub-threshold current in the standby state is often increased.

FIG. 17 is a circuit diagram showing an example in which the enable signal is supplied to a path through which the complementary input signal passes.

A circuit shown in FIG. 17 differs from that shown in FIG. 16 in that the first-stage inverters 31 and 41 shown in FIG. 16 are replaced by NAND circuits 51 and 61. Input nodes on one side of the NAND circuits 51 and 61 are supplied with the input signals IN and INB, respectively, and input nodes on the other side are commonly supplied with an enable signal E. Thereby, when the enable signal E is the high level (when the data input/output width is 16 bits, for example), two paths shown in FIG. 17 are rendered effective. On the other hand, when the enable signal E is the low level (when the data input/output width is 8 bits, for example), the two paths shown in FIG. 17 are rendered ineffective, and irrespective of logical levels of the input signals IN and INB, output is fixed.

The circuit shown in FIG. 17 is equivalent to that shown in FIG. 16 when the enable signal E is the high level, and thus, there occurs no problem. However, when the enable signal E is the low level, a connection relationship to the main power supply wiring and the pseudo power supply wiring in the path through which the input signal IN passes is opposite to the connection originally required.

That is, when the enable signal E is the low level, outputs of the NAND circuit 51 and the inverters 32, 33, 34, ... that configure the path are rendered the high level, the low level, the high level, the low level, ..., respectively, and in the connection shown in FIG. 17, a transistor side to be turned on is connected to the pseudo power supply wiring and a transistor side to be turned off is connected to the main power supply wiring, and with this state, the connection is fixed. Thus, when the enable signal E is the low level, it is not possible to render pseudo power supply wiring non-conducting the in the standby state, and as a result, there occurs a problem that the sub-threshold current increases.

FIG. 18 is a circuit diagram showing an example in which the sub-threshold current is reduced by improving the circuit shown in FIG. 17.

A circuit shown in FIG. 18 differs from that shown in FIG. 17 in that the NAND circuit 51 shown in FIG. 17 is replaced by an NOR circuit 71 and in addition, an inverter 70 is added. The NOR circuit 71 is supplied with a signal obtained by inverting the enable signal E by the inverter 70. Thus, when the enable signal E is the low level or when the input signal IN is fixed to the high level by the standby, output of the NOR circuit 71 is always fixed to the low level. As a result, it becomes possible to solve the problem inherent in the circuit shown in FIG. 17.

However, in the circuit shown in FIG. 18, a path through which the input signal IN passes and that through which the input signal INB passes differ in the circuit configuration. Thus, it is probable that a symmetric property of waveforms of the signals that pass the two paths collapses. As a result, when a high symmetric property is required for the complementary signal as in the case of a DLL (Delayed Lock Loop) circuit used for a DRAM or the like, it is not appropriate to use the circuit shown in FIG. 18.

SUMMARY OF THE INVENTION

The present invention has been achieved to solve the problems. It is therefore an object of the present invention to provide a semiconductor device including a circuit in which an enable signal is supplied to a path to which a complementary input signal is supplied, in which a sub-threshold current is inhibited irrespective of a logical level of the enable signal and a symmetric property of a complementary signal is retained.

The above and other objects of the present invention can be accomplished by a semiconductor device, comprising:

a first gate circuit including a first logical unit having at least first and second input nodes, and a second logical unit receiving an output signal from the first logical unit and having at least a third input node; and a second gate circuit substantially having the same circuit configuration as the first gate circuit and having fourth to sixth input nodes each corresponding to the first to third input nodes, wherein the first and fourth input nodes are supplied with complementary input signals, the second and sixth input nodes are each supplied with predetermined power supply potentials, the third and fifth input nodes are supplied with enable signal, and one of a pair of power supply terminals included in the first and second gate circuits being connected to a main power supply wiring and the other of the pair of power supply terminals being connected to a pseudo power supply wiring.

In the present invention, a first gate circuit and a second gate circuit being substantially the same in the circuit configuration means that the both circuits are the same except for a connection relationship to a power supply wiring (a main power supply wiring or a pseudo power supply wiring) and a connection relationship of input nodes or output nodes.

As first and second gate circuits, an AND-NOR composite gate can be used. In this case, it is possible that enable signals supplied to second and sixth input nodes are complementary signals, a power supply potential indicating a low level is supplied to a third input node, and a power supply potential indicating a high level is supplied to a fifth input node.

As the first and second gate circuits, an OR-NAND composite gate can also be used. In this case, it is possible that enable signals supplied to the second and sixth input nodes are complementary signals, a power supply potential indicating a high level is supplied to the third input node, and a power supply potential indicating a low level is supplied to the fifth input node.

As described above, in the semiconductor device according to the present invention, the first and second gate circuits have the same configuration to each other. As a result, it becomes possible to retain a symmetric property of the complementary signal that passes through the first and second gate circuits. Further, outputs of the first and second gate circuits are fixed irrespective of a logical level of the enable signal. Thus, it is also possible to achieve inhibiting of a sub-threshold current.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
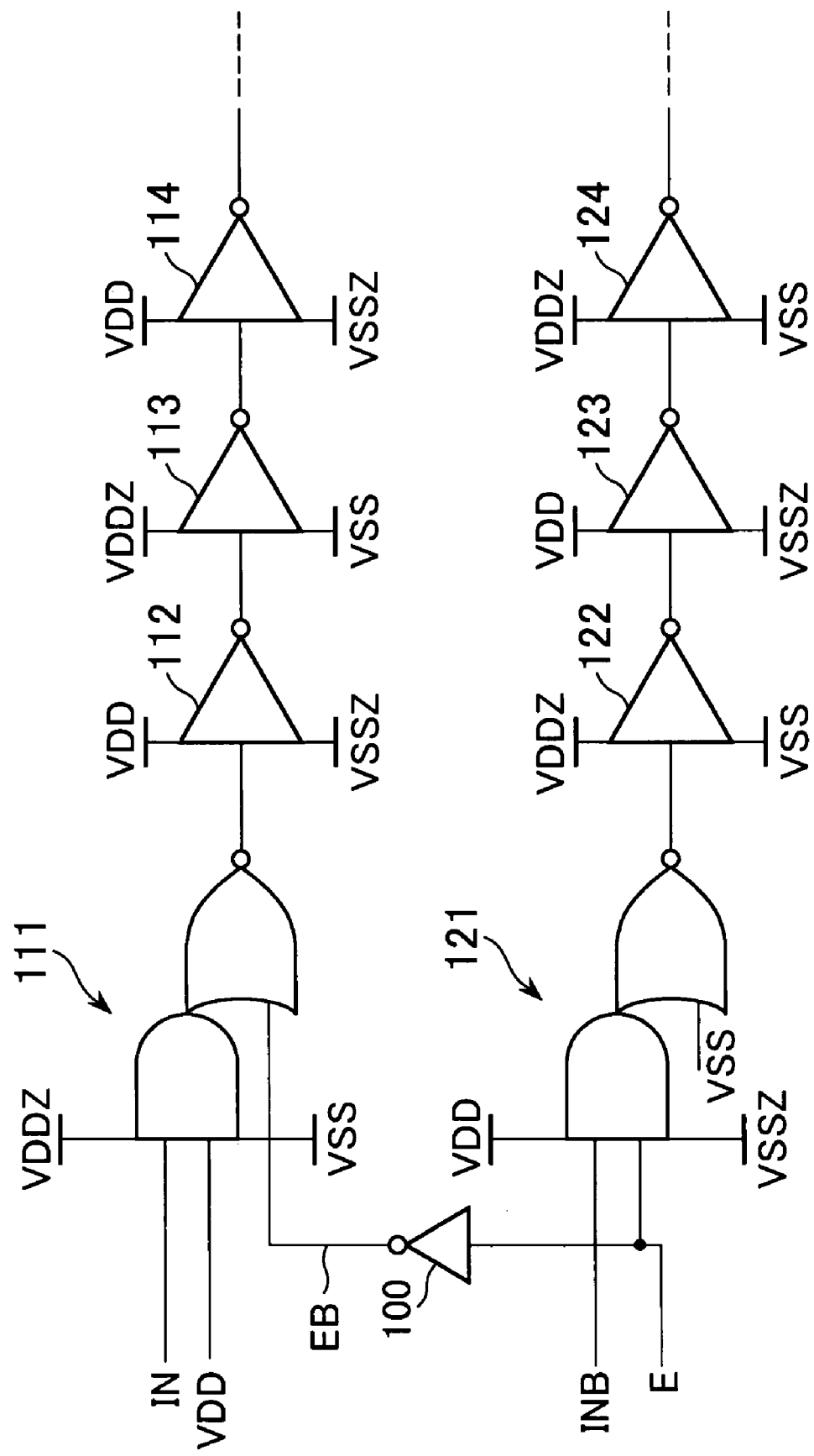
FIG. 1 is a circuit diagram of a semiconductor device according to a preferred first embodiment of the present invention.

FIG. 1 is a circuit diagram of a semiconductor device according to a preferred first embodiment of the present invention.

As shown in FIG. 1, the semiconductor device according to the present embodiment includes a first AND-NOR composite gate 111 and a second AND-NOR composite gate 121 to which complementary input signals IN and INB are supplied, respectively. At later stages of the first and second AND-NOR composite gates 111 and 121, various gate circuits are dependently connected. In the present embodiment, as an example, inverters 112 to 114, . . . and 122 to 124, . . . are dependently connected, respectively.

The first AND-NOR composite gate 111 is a 3-input composite gate circuit, and is configured logically of a 2-input AND-based logical unit (AND unit), and an OR-based logical unit (NOR unit) that receives output of the AND-based logical unit and third input. The AND-based logical unit (AND unit) is supplied with an input signal IN and an electric potential (high level) of a main power supply wiring VDD, and the OR-based logical unit (NOR unit) is supplied with a signal EB obtained by inverting an enable signal E by an inverter 100. As shown in FIG. 1, power supply terminals of the first AND-NOR composite gate 111 have its high-order side being connected to a pseudo power supply wiring VDDZ and its low-order side being connected to a main power supply wiring VSS.

The second AND-NOR composite gate 121 also is a 3-input composite gate circuit, and has the same circuit configuration as the first AND-NOR composite gate 111. An AND-based logical unit (AND unit) of the second AND-NOR composite gate 121 is supplied with an inverted input signal INB and an enable signal E, and an OR-based logical unit (NOR unit) is supplied with an electric potential (low level) of the main power supply wiring VSS. Power supply terminals of the second AND-NOR composite gate 121 have its high-order side being connected to the main power supply wiring VDD and the other side being connected to the pseudo power supply wiring VSSZ.

The input signals IN and INB have their logic fixed in a standby state. In the example, in the standby state, the input signal IN is fixed to the high level, and the inverted signal INB is fixed to the low level. Needless to say, logical values of the input signals IN and INB vary in an active state as needed. On the other hand, the enable signal E is a signal of which logical level is fixed by cutting a fuse at the time of production, for example.

At a later stage of the first AND-NOR composite gate 111, inverters 112 to 114 . . . are dependently connected. Assuming that the first AND-NOR composite gate 111 is a first-stage gate circuit, regarding a path through which the input signal IN passes, the gate circuits 111, 113, . . . at the odd-numbered stages (a first stage, a third stage, . . . ) are connected between the pseudo power supply wiring VDDZ and the main power supply wiring VSS, and the gate circuit 112, 114, . . . at even-numbered stages (a second stage, a fourth stage, . . . ) are connected between the main power supply wiring VDD and the pseudo power supply wiring VSSZ.

On the other hand, at a later stage of the second AND-NOR composite gate 121, inverters 122 to 124 . . . are dependently connected. Assuming that the second AND-NOR composite gate 121 is a first-stage gate circuit, regarding a path through which the input signal INB passes, the gate circuits 121, 123, . . . at the odd-numbered stages (a first stage, a third stage, . . . ) are connected between the main power supply wiring VDD and the pseudo power supply wiring VSSZ, and the gate circuits 122, 124, . . . at even-numbered stages (a second stage, a fourth stage, . . . ) are connected between the pseudo power supply wiring VDDZ and the main power supply wiring VSS.

The main power supply wiring VDD and the pseudo power supply wiring VDDZ, and the main power supply wiring VSS and the pseudo power supply wiring VSSZ are connected in the active state and disconnected in the standby state. The active state is a period during which the logical levels of the input signals IN and INB vary as needed, and this period corresponds to a period during which a read/write operation is executed in the case of a DRAM, for example. On the other hand, the standby state is a period during which the logical levels of the input signals IN and INB are fixed, and this period corresponds to a period during which the read/write operation is not executed in the case of the DRAM, for example. As described above, in the example, in the standby state, the input signal IN is fixed to the high level, and the inverted signal INB is fixed to the low level.

Figure 2:
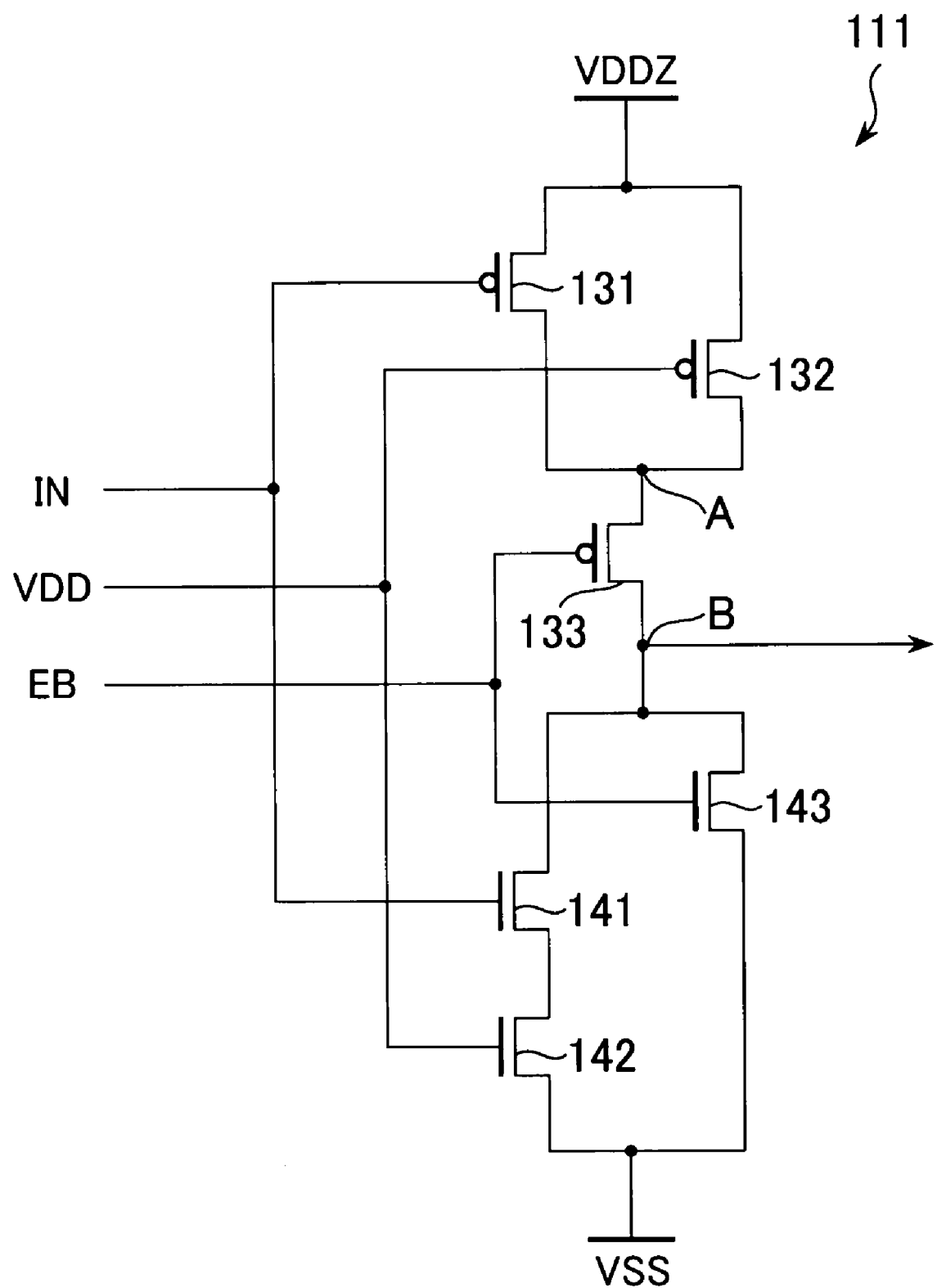
FIG. 2 is a circuit diagram showing in more detail the first AND-NOR composite gate shown in FIG. 1.

FIG. 2 is a circuit diagram showing in more detail the first AND-NOR composite gate 111.

As shown in FIG. 2, the first AND-NOR composite gate 111 has two connection points A and B between the pseudo power supply wiring VDDZ and the main power supply wiring VSS. Between the pseudo power supply wiring VDDZ and the connection point A, P-channel MOS transistors 131 and 132 are connected in parallel, and between the connection points A and B, a P-channel MOS transistor 133 is connected. Between the connection point B and the main power supply wiring VSS, N-channel MOS transistors 141 and 142 are connected in series, and these N-channel MOS transistors 141 and 142 are connected in parallel with the N-channel MOS transistor 143. The connection point B is an output node of the first AND-NOR composite gate 111, and connected to an input node of the inverter 112 at a subsequent stage.

Gates of the transistors 131 and 141 are commonly supplied with the input signal IN, gates of the transistors 132 and 142 are commonly supplied with the electric potential of the main power supply wiring VDD, and gates of the transistors 133 and 143 are commonly supplied with an inverted signal EB of the enable signal E. Thereby, when the inverted signal EB is the low level, the first AND-NOR composite gate 111 functions as an inverter for inverting the input signal IN. Accordingly, in the standby state, when the input signal IN is fixed to the high level, the connection point B, which is an output node, is disconnected from the pseudo power supply wiring VDDZ but connected to the main power supply wiring VSS. Thereby, the sub-threshold current in the standby state is inhibited.

On the other hand, when the inverted signal EB is the high level, the output is fixed to the low level irrespective of the logical level of the input signal IN. That is, when the inverted signal EB is the high level, the connection point B, which is an output node, is disconnected from the pseudo power supply wiring VDDZ but connected to the main power supply wiring VSS. Thereby, the sub-threshold current when the path is rendered non-usable by the enable signal E is inhibited.

Figure 3:
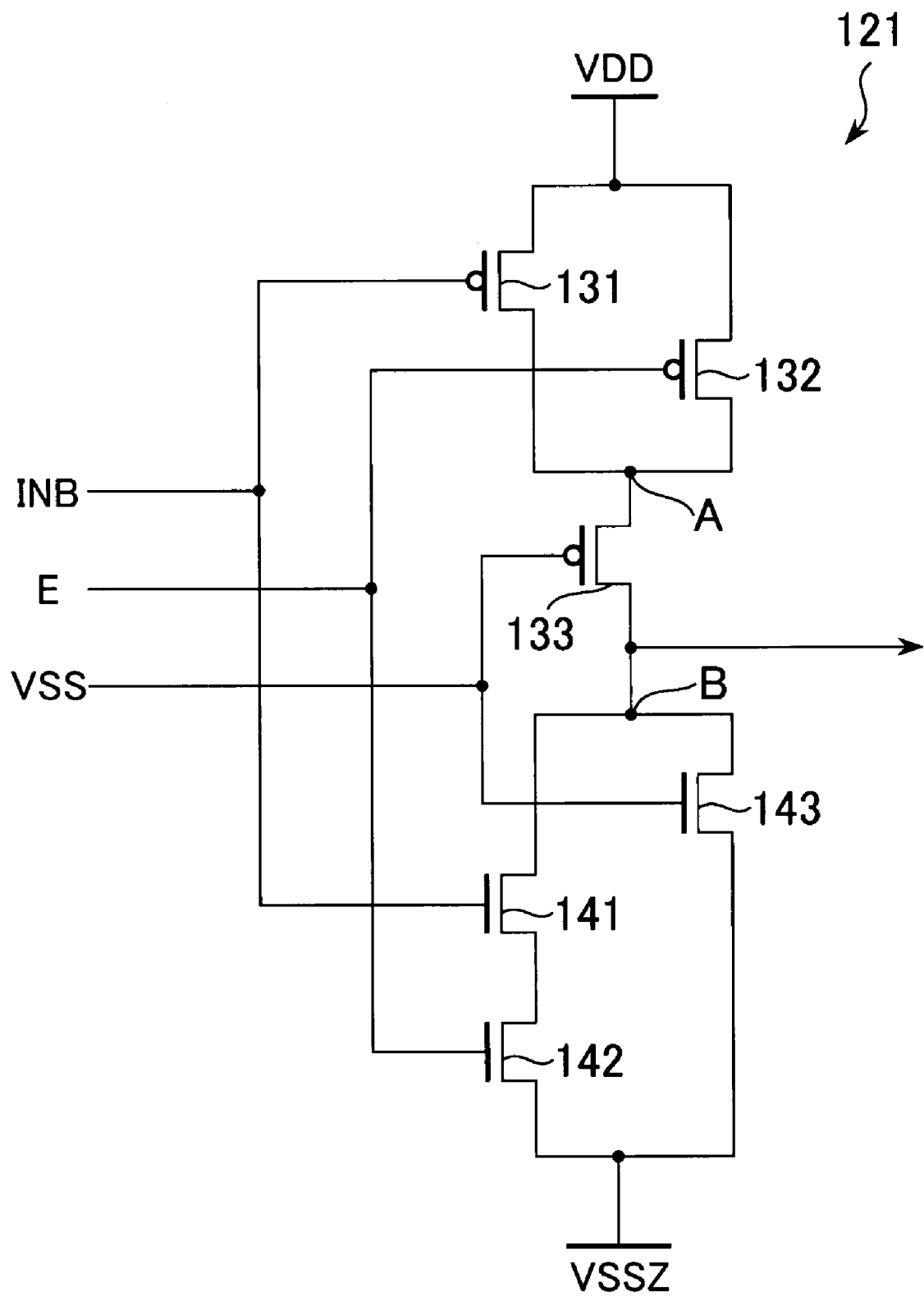
FIG. 3 is a circuit diagram showing in more detail the second AND-NOR composite gate shown in FIG. 1.

FIG. 3 is a circuit diagram showing in more detail the second AND-NOR composite gate 121.

As shown in FIG. 3, the second AND-NOR composite gate 121 has the same circuit configuration as the first AND-NOR composite gate 111 shown in FIG. 2 except that it is connected between the main power supply wiring VDD and the pseudo power supply wiring VSSZ. In the second AND-NOR composite gate 121, the gates of the transistors 131 and 141 are commonly supplied with the input signal INB, the gates of the transistors 132 and 142 are commonly supplied with the enable signal E, and the gates of the transistors 133 and 143 are commonly supplied with the electric potential of the main power supply wiring VSS.

Thereby, when the enable signal E is the high level, the second AND-NOR composite gate 121 functions as an inverter for inverting the input signal INB. Accordingly, when the input signal INB is fixed to the low level in the standby state, the connection point B, which is the output node, is disconnected from the pseudo power supply wiring VSSZ but connected to the main power supply wiring VDD. Thereby, the sub-threshold current in the standby state is inhibited.

On the other hand, when the enable signal E is the low level, the output is fixed to the high level irrespective of the logical level of the input signal INB. That is, when the enable signal E is the low level, the connection point B, which is the output node, is disconnected from the pseudo power supply wiring VSSZ but connected to the main power supply wiring VDD. Thereby, the sub-threshold current when the path is rendered non-usable by the enable signal E is inhibited.

Thus, the semiconductor device according to the present embodiment uses the AND-NOR composite gates 111 and 121. As a result, irrespective of the logical level of the enable signal, the sub-threshold current of the two paths to which the complementary input signals IN and INB are supplied can be inhibited. Further, these two paths have the same circuit configuration, and thus, the symmetric property of the complementary signal is retained.

A preferred second embodiment of the present invention is explained next.

Figure 4:
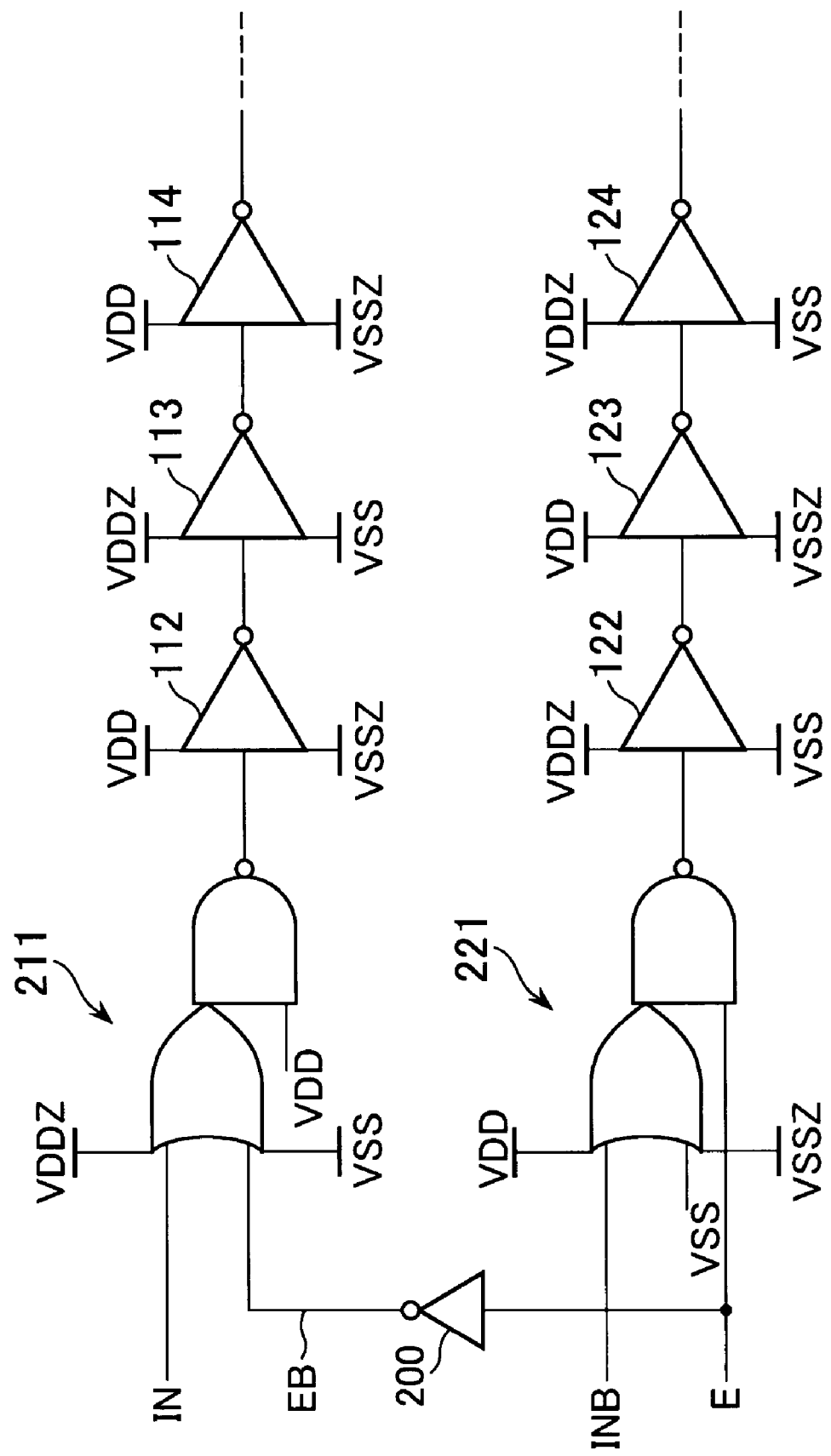
FIG. 4 is a circuit diagram of a semiconductor device according to a preferred second embodiment of the present invention.

FIG. 4 is a circuit diagram of a semiconductor device according to the second embodiment of the present invention.

As shown in FIG. 4, in the semiconductor device of the present embodiment, the first and second AND-NOR composite gates 111 and 121 shown in FIG. 1 are replaced by first and second OR-NAND composite gates 211 and 221, respectively.

The first OR-NAND composite gate 211 is a 3-input composite gate circuit, and configured logically of a 2-input OR-based logical unit (OR unit) and an AND-based logical unit (NAND unit) that receives output of the OR-based logical unit and third input. The OR-based logical unit (OR unit) is supplied with the input signal IN and the signal EB obtained by inverting the enable signal E by an inverter 200, and the AND-based logical unit (NAND unit) is supplied with the electric potential of the main power supply wiring VDD. As shown in FIG. 1, power supply terminals of the first OR-NAND composite gate 211 have its high-order side being connected to the pseudo power supply wiring VDDZ and its low-order side being connected to the main power supply wiring VSS.

The second OR-NAND composite gate 221 also is a 3-input composite gate circuit, and has the same circuit configuration as the first OR-NAND composite gate 211. The OR-based logical unit (OR unit) of the second OR-NAND composite gate 221 is supplied with the inverted input signal INB and the electric potential of the main power supply wiring VSS, and the AND-based logical unit (NAND unit) is supplied with the enable signal E. Power supply terminals of the second OR-NAND composite gate 221 have its high-order side being connected to the main power supply wiring VDD and the other side being connected to the pseudo power supply wiring VSSZ.

Figure 5:
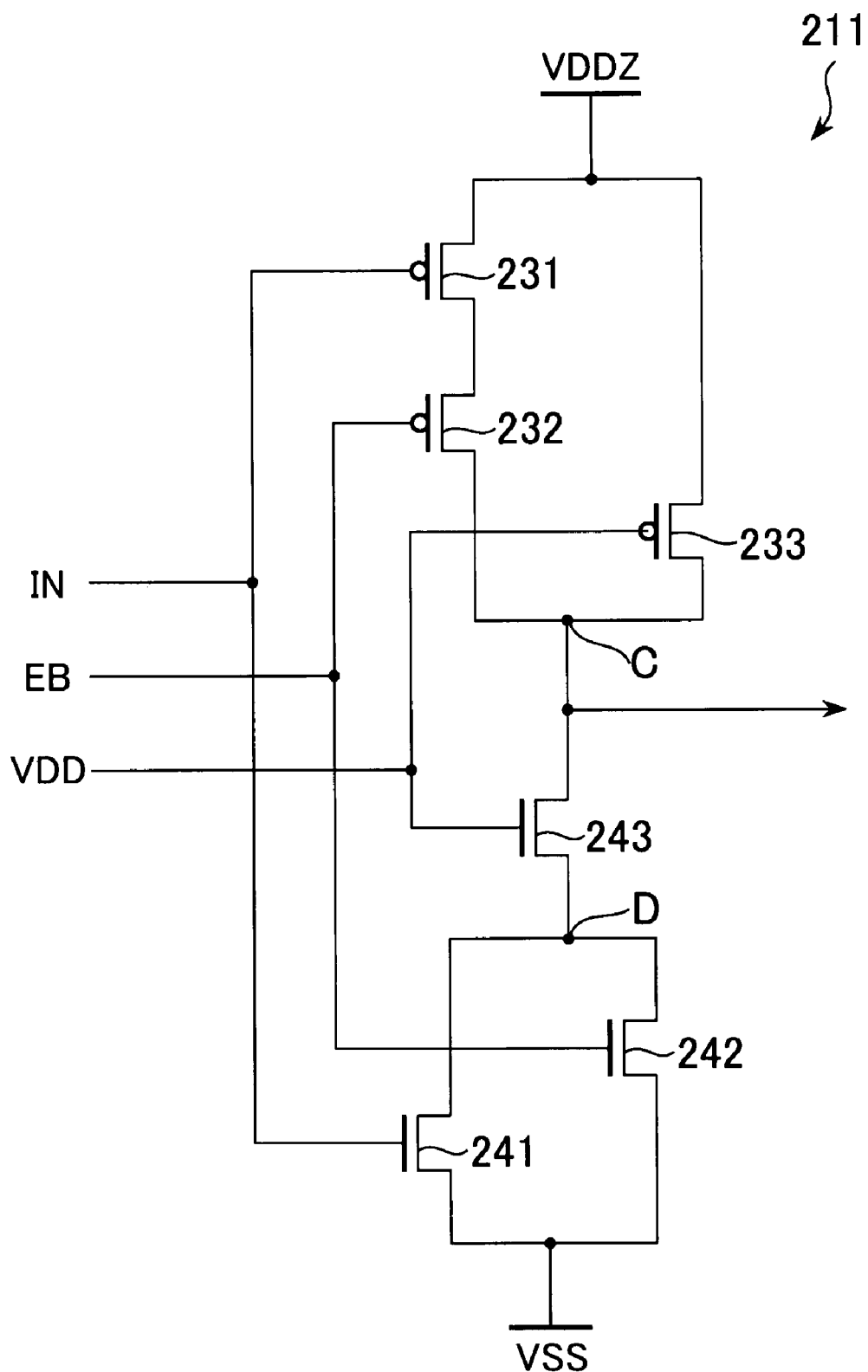
FIG. 5 is a circuit diagram showing in more detail the first OR-NAND composite gate shown in FIG. 4.

FIG. 5 is a circuit diagram showing in more detail the first OR-NAND composite gate 211.

As shown in FIG. 5, the first OR-NAND composite gate 211 has two connection points C and D between the pseudo power supply wiring VDDZ and the main power supply wiring VSS. Between the pseudo power supply wiring VDDZ and the connection point C, P-channel MOS transistors 231 and 232 are connected in series, and these P-channel MOS transistors 231 and 232 are connected in parallel with the P-channel MOS transistor 233. Between the connection points C and D, an N-channel MOS transistor 234 is connected, and between the connection point D and the main power supply wiring VSS, N-channel MOS transistors 241 and 242 are connected in parallel. The connection point C is an output node of the first OR-NAND composite gate 211, and connected to an input node of the inverter 112 at a subsequent stage.

Gates of the transistors 231 and 241 are commonly supplied with the input signal IN, gates of the transistors 232 and 242 are commonly supplied with the inverted signal EB of the enable signal E, and gates of the transistors 233 and 243 are commonly supplied with the electric potential of the main power supply wiring VDD. Thereby, the first OR-NAND composite gate 211 functions completely the same as the first AND-NOR composite gate 111 shown in FIG. 2.

Figure 6:
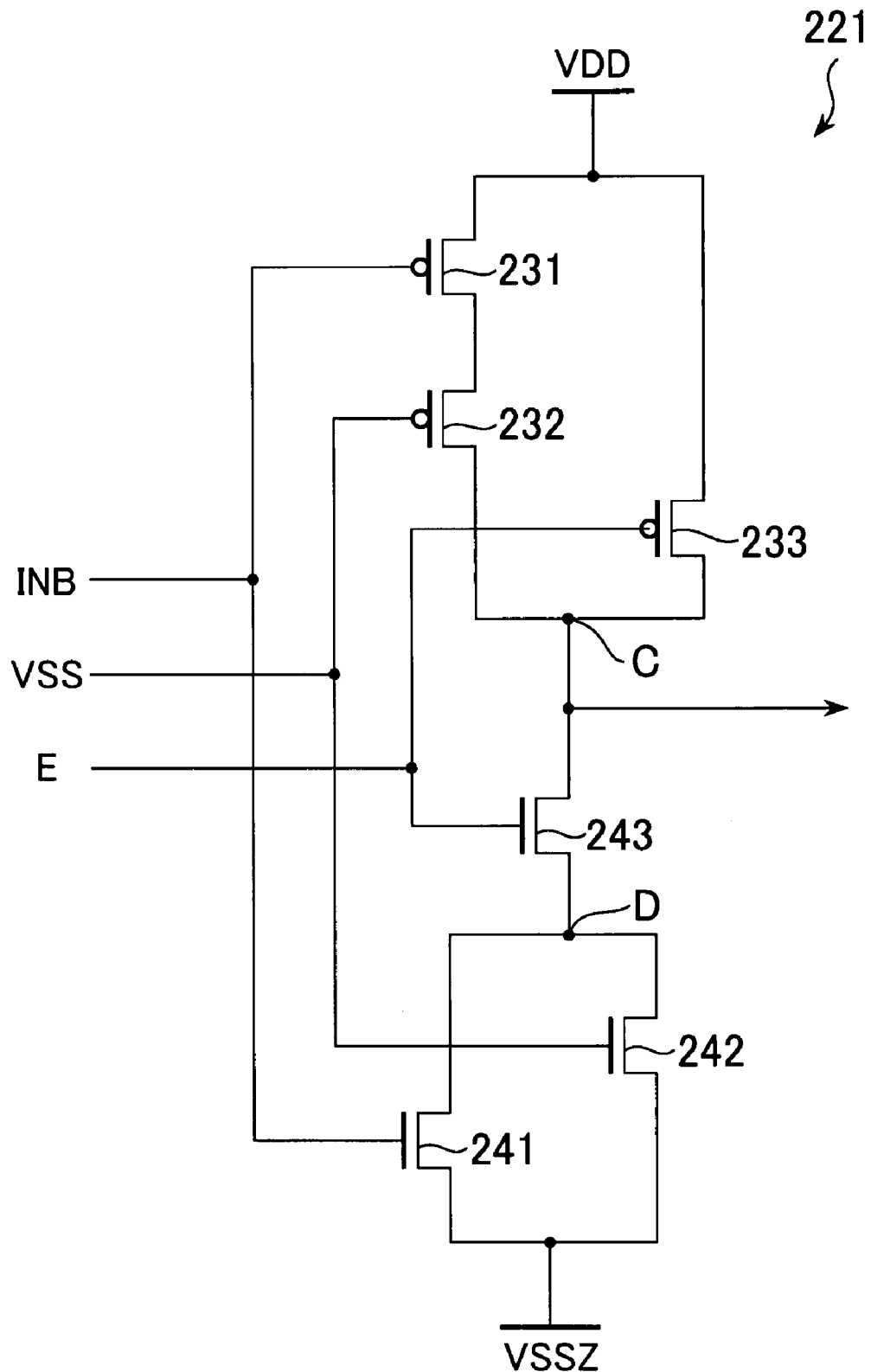
FIG. 6 is a circuit diagram showing in more detail the second OR-NAND composite gate shown in FIG. 4.

FIG. 6 is a circuit diagram showing in more detail the second OR-NAND composite gate 221.

As shown in FIG. 6, the second OR-NAND composite gate 221 has the same circuit configuration as the first OR-NAND composite gate 211 shown in FIG. 5 except that it is connected between the main power supply wiring VDD and the pseudo power supply wiring VSSZ. In the second OR-NAND composite gate 221, the gates of the transistors 231 and 241 are commonly supplied with the input signal INB, the gates of the transistors 232 and 242 are commonly supplied with the electric potential of the main power supply wiring VSS, and the gates of the transistors 233 and 243 are commonly supplied with the enable signal E. Thereby, the second OR-NAND composite gate 221 functions completely the same as the second AND-NOR composite gate 121 shown in FIG. 3.

Thus, instead of the AND-NOR composite gates 111 and 121, the OR-NAND composite gates 211 and 221 are used. As a result, the same effect as that in the first embodiment can also be achieved.

A preferred third embodiment of the present invention is explained next.

Figure 7:
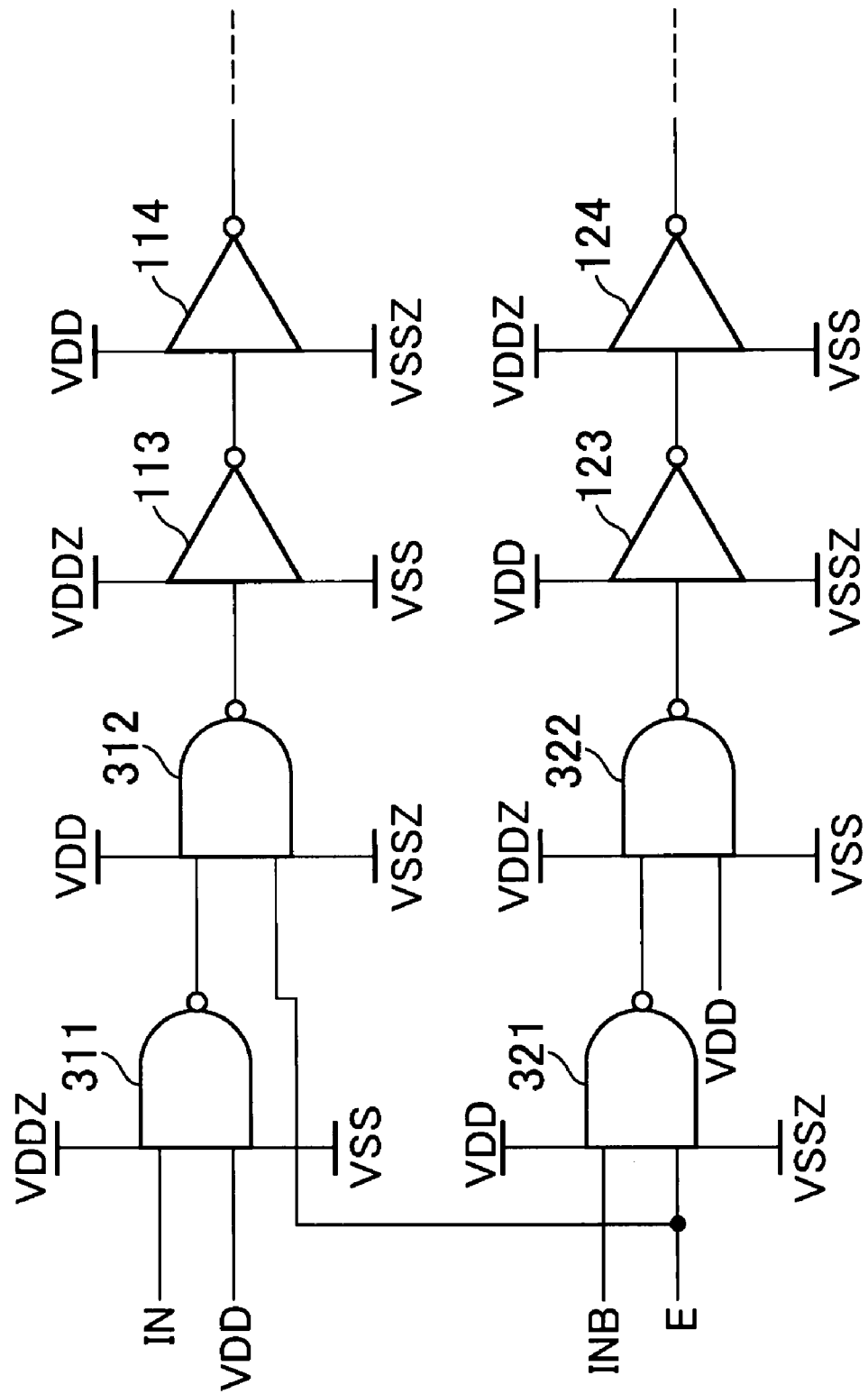
FIG. 7 is a circuit diagram of a semiconductor device according to a preferred third embodiment of the present invention.

FIG. 7 is a circuit diagram of a semiconductor device according to the third embodiment of the present invention.

As shown in FIG. 7, in the semiconductor device according to the present embodiment, the first and second AND-NOR composite gates 111 and 121 shown in FIG. 1 are replaced by NAND circuits 311 and 321, and the inverters 112 and 122 are replaced by NAND circuits 312 and 322, respectively.

The NAND circuits 311, 312, 321, and 322 are each 2-input NAND circuits. The NAND circuit 311 is supplied with the input signal IN and the electric potential of the main power supply wiring VDD, and the NAND circuit 312 is supplied with output of the NAND circuit 311 and the enable signal E. On the other hand, the NAND circuit 321 is supplied with the input signal INB and the enable signal E, and the NAND circuit 322 is supplied with output of the NAND circuit 321 and the electric potential of the main power supply wiring VDD. The NAND circuits 311 and 322 are connected between the pseudo power supply wiring VDDZ and the main power supply wiring VSS, and the NAND circuits 312 and 321 are connected between the main power supply wiring VDD and the pseudo power supply wiring VSSZ.

The circuit according to the present embodiment functions nearly the same as those in the first and second embodiments. That is, when the enable signal E is the high level, all the NAND circuits 311, 312, 321, and 322 function as the inverters, and when the enable signal E is the low level, output of each path is fixed. When logics of the input signals IN and INB are fixed in the standby state, transistors on the conducting side are connected to the main power supply wiring and transistors on the non-conducting side are connected to the pseudo power supply wiring. Thus, it becomes possible to inhibit the sub-threshold current. However, even when the enable signal E is the low level, the first-stage NAND circuit 311 performs switching. Thus, power consumption in this portion occurs. Accordingly, when the reduction in power consumption is prioritized, it is desired to use the composite gate as in the first and second embodiments.

The circuit according to the present embodiment does not use the composite gate. Thus, it becomes possible to reduce the number of transistors connected in series between power supplies. That is, when the number of transistors connected in series between the power supplies is large, there occurs a need for increasing the size of transistors to retain an amount of current in some cases. However, in this embodiment, there is no such a need. Thus, it becomes possible to inhibit an increase of an occupying area.

A preferred fourth embodiment of the present invention is explained next.

Figure 8:
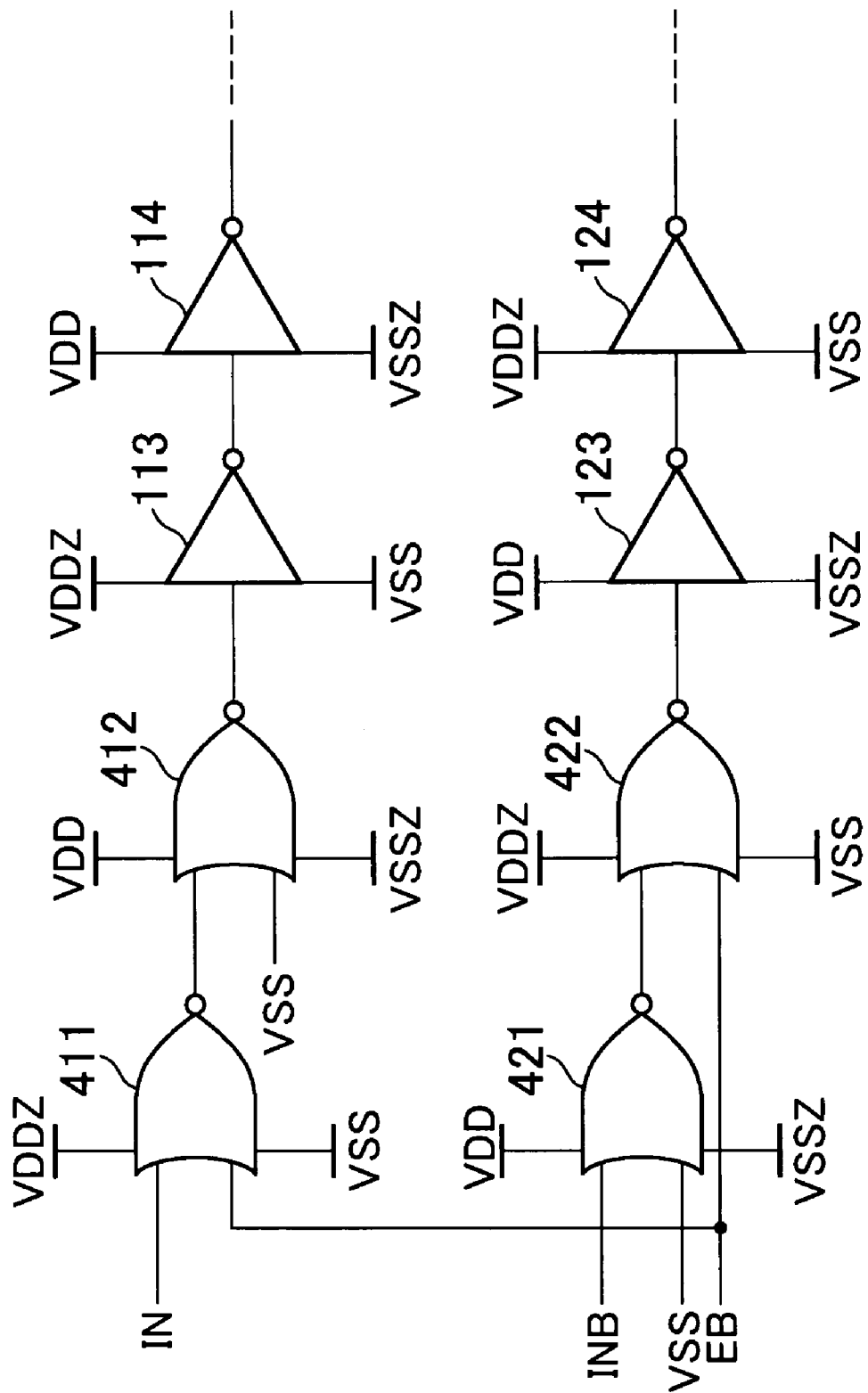
FIG. 8 is a circuit diagram of a semiconductor device according to a preferred fourth embodiment of the present invention.

FIG. 8 is a circuit diagram of a semiconductor device according to the fourth embodiment of the present invention.

As shown in FIG. 8, in the semiconductor device according to the present embodiment, the NAND circuits 311, 312, 321, and 322 shown in FIG. 7 are replaced by NOR circuits 411, 412, 421, and 422, respectively.

The NOR circuits 411, 412, 421, and 422 are each 2-input NOR circuits. The NOR circuit 411 is supplied with the input signal IN and the inverted signal EB of the enable signal E, and the NOR circuit 412 is supplied with output of the NOR circuit 411 and the electric potential of the main power supply wiring VSS. On the other hand, the NOR circuit 421 is supplied with the input signal INB and the electric potential of the main power supply wiring VSS, and the NOR circuit 422 is supplied with output of the NOR circuit 421 and the inverted signal EB of the enable signal E. The NOR circuits 411 and 422 are connected between the pseudo power supply wiring VDDZ and the main power supply wiring VSS, and the NOR circuits 412 and 421 are connected between the main power supply wiring VDD and the pseudo power supply wiring VSSZ.

The circuit according to the present embodiment functions the same as that in the third embodiment. That is, even when the NOR circuit is used instead of the NAND circuit, the same effect as that of the third embodiment can also be achieved.

An example where the enable signal is 1 bit has been explained above. However, the present invention can be applicable even in a case where the enable signal is 2 bits or more.

Figure 9:
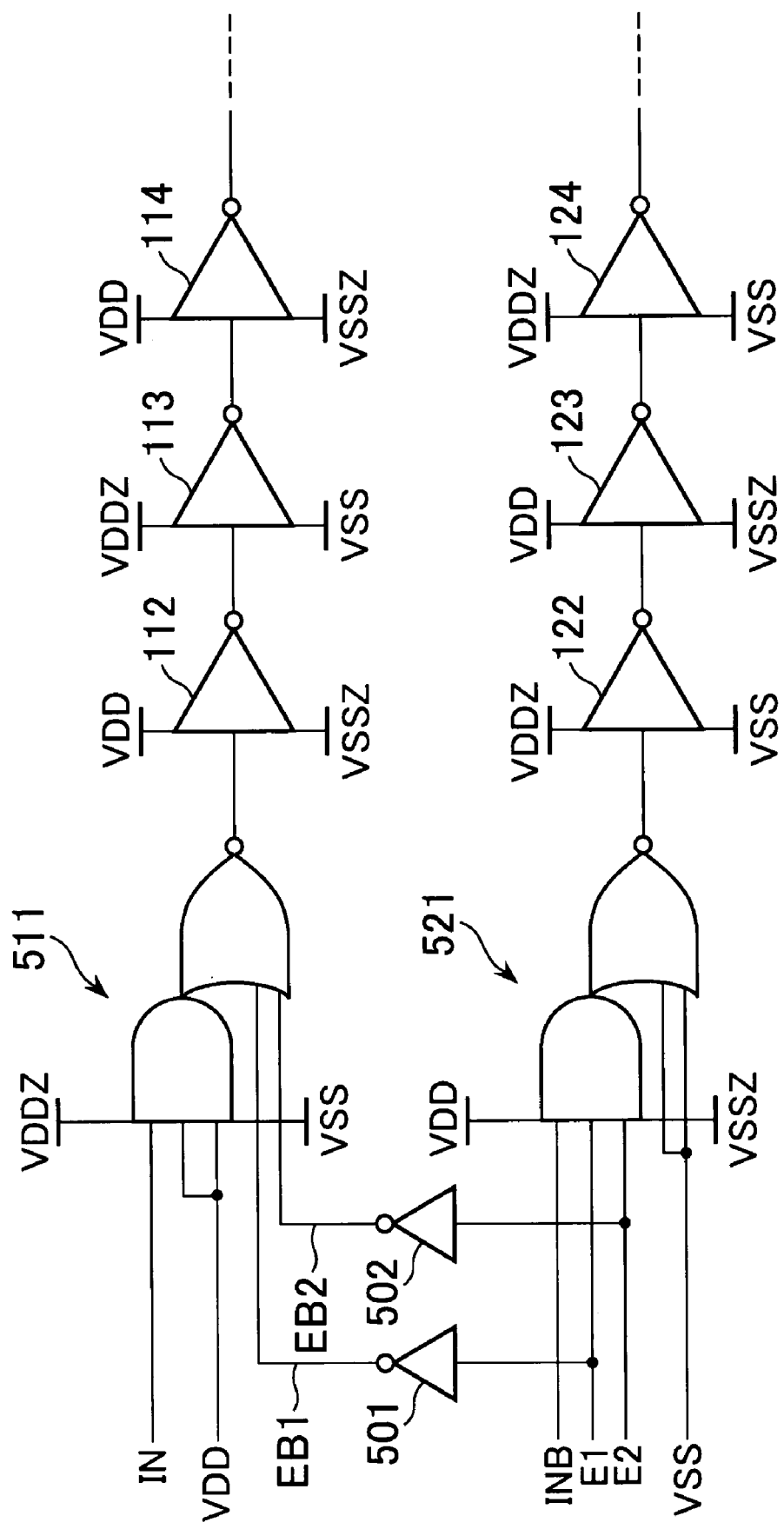
FIG. 9 is a circuit diagram showing a modification of the first embodiment shown in FIG. 1.

FIG. 9 is a circuit diagram showing a modification of the first embodiment shown in FIG. 1, and shows a case where the enable signal is 2 bits.

As shown in FIG. 9, in the semiconductor device according to the modification embodiment, the first and second AND-NOR composite gates 111 and 121 shown in FIG. 1 are replaced by 5-input AND-NOR composite gates 511 and 521, respectively.

The first AND-NOR composite gate 511 is configured logically of a 3-input AND-based logical unit (AND unit) and an OR-based logical unit (NOR unit) that receives output of the AND-based logical unit and fourth and fifth inputs. A first input node of the AND-based logical unit (AND unit) is supplied with the input signal IN, and both second and third input nodes are supplied with the electric potential of the main power supply wiring VDD. The OR-based logical unit (NOR unit) is supplied with a signal EB1 obtained by inverting a first enable signal E1 by an inverter 501 and a signal EB2 obtained by inverting a second enable signal E2 by an inverter 502.

On the other hand, in the second AND-NOR composite gate 521, a first input node of the AND-based logical unit (AND unit) is supplied with the input signal INB, and second and third input nodes are supplied with the first and second enable signals E1 and E2, respectively. Two input nodes of the OR-based logical unit (NOR unit) is supplied with the electric potential of the main power supply wiring VSS.

With such a configuration, when both the first and second enable signals E1 and E2 are the high level, the same operation as when the enable signal E is the high level in the first embodiment is performed. Alternatively, when at least one of the first and second enable signals E1 and E2 is the low level, the same operation as when the enable signal E is the low level in the first embodiment is performed.

Thus, the present invention can be applicable even in the case where the enable signal is 2 bits or more.

Figure 10:
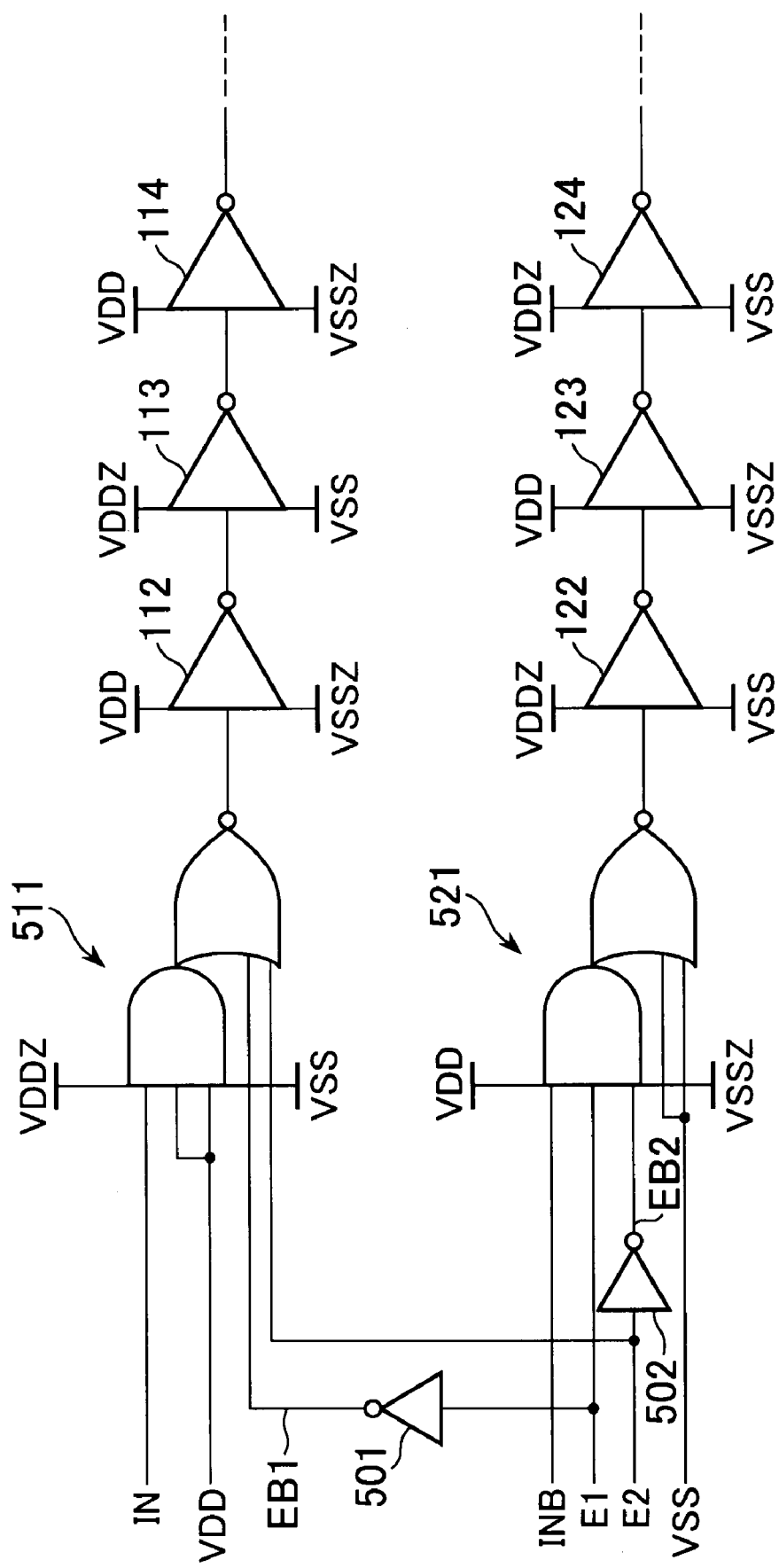
FIG. 10 is a circuit diagram showing another modification of the first embodiment shown in FIG. 1.

In the example shown in FIG. 9, provided is a circuit usable when both the first and second enable signals E1 and E2 are the high level. However, a combination of the logics of the enable signals is arbitrary. For example, to render the circuit usable when the first enable signal E1 is the high level and the second enable signal E2 is the low level, the circuit can be configured such that as shown in FIG. 10, a connection position of the inverter 502 is changed to directly supply the second enable signal E2 to the first AND-NOR composite gate 511 and supply an inverted signal EB2 of the second enable signal E2 to the second AND-NOR composite gate 521.

Figure 11:
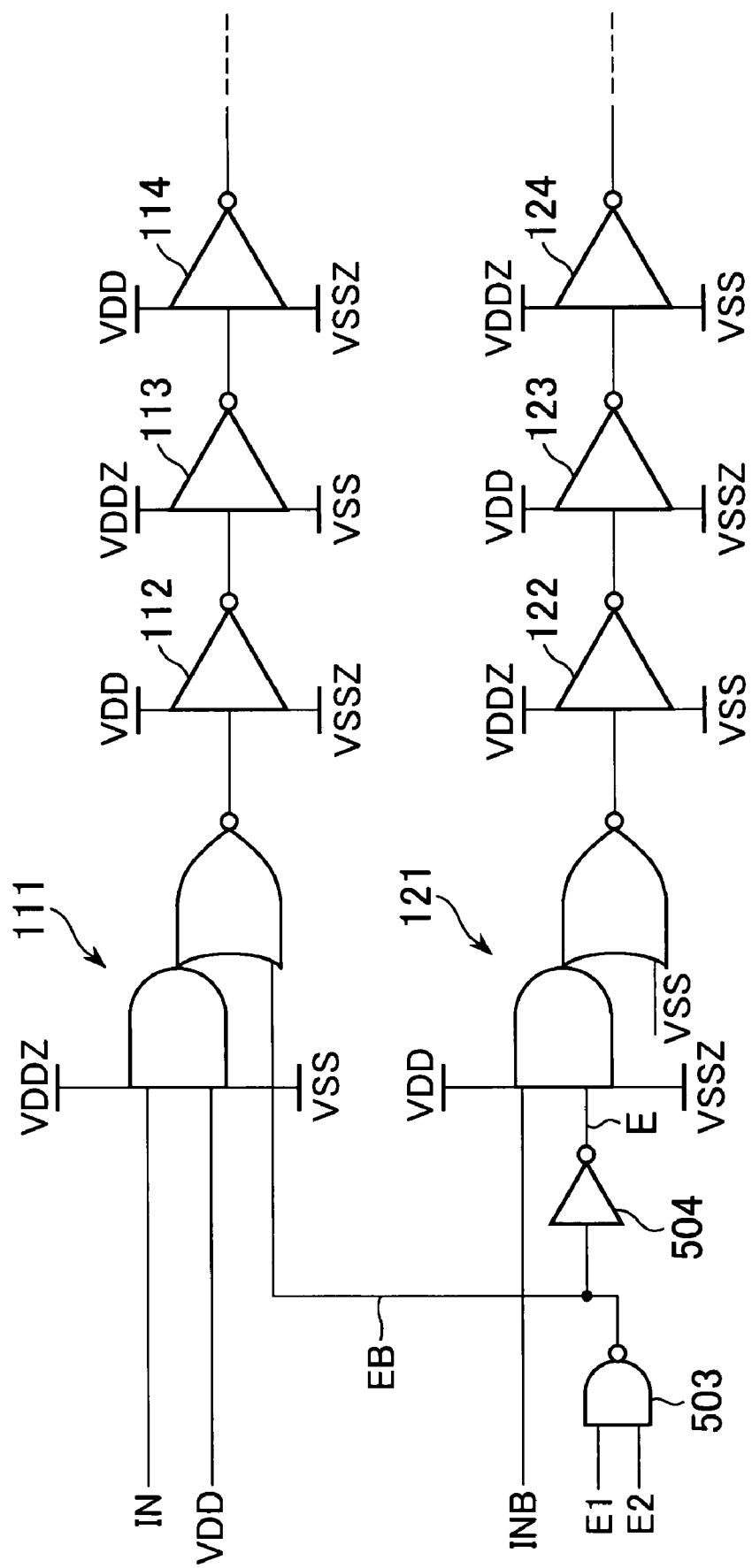
FIG. 11 is a circuit diagram showing still another modification of the first embodiment shown in FIG. 1.

In the example shown in FIG. 9, the 5-input AND-NOR composite gates 511 and 521 are used. As a result, the number of transistors connected in series between the power supplies is considerably large as compared to the general gate circuit. When there is a need to avoid this, as shown in FIG. 11, it can be possible to add, instead of basically using the circuit shown in FIG. 1 as it is, an NAND circuit 503 that receives the first and second enable signals E1 and E2 and an inverter 504 that receives output of the NAND circuit 503 thereby to additionally perform a logic operation using the first and second enable signals E1 and E2. In the example shown in FIG. 11, a signal EB, which is output of the NAND circuit 503, is supplied to the first AND-NOR composite gate 111, and a signal E, which is output of the inverter 504, is supplied to the second AND-NOR composite gate 121. Thereby, the circuit basically the same as that shown in FIG. 1 is rendered usable.

Thus, when the gate circuit that performs the logic operation in advance by receiving a plurality of enable signals is added, it becomes possible to reduce the number of transistors connected in series between the power supplies in the composite gate. Since the gate circuit that performs the logic operation of the enable signal is added, a predetermined delay occurs to a change of the enable signal. However, the logic of the enable signal is basically not changed, and thus, this seldom gives rise to a substantial problem.

Figure 12:
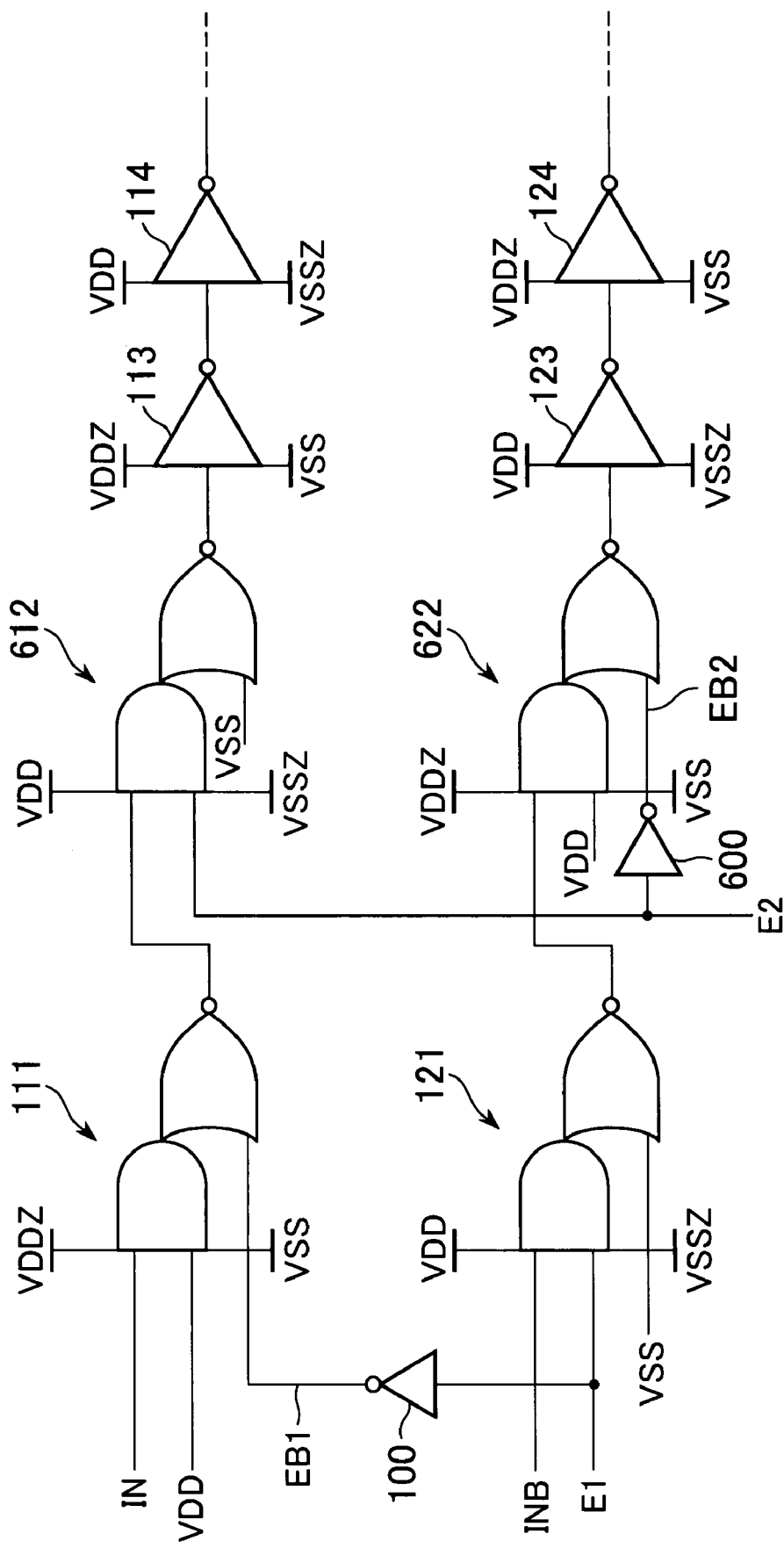
FIG. 12 is a circuit diagram showing still another modification of the first embodiment shown in FIG. 1.

Alternatively, as shown in FIG. 12, when the inverters 112 and 122 shown in FIG. 1 are replaced by third and fourth AND-NOR composite gates 612 and 622, respectively, it becomes also possible to respond to 2-bit enable signals E1 and E2. In the third and fourth AND-NOR composite gates 612 and 622, the same connection as those of the second and first AND-NOR composite gates 121 and 111 is made, respectively, except that instead of the enable signal E1, the enable signal E2 is supplied therein.

Also in this example, it becomes possible to avoid the use of a multiple-input composite gate. However, even when the second enable signal E2 is the low level, if the first enable signal E1 is the high level, the first-stage AND-NOR composite gates 111 and 121 perform switching. Thus, in this portion, power consumption occurs.

The present invention can preferably apply to the semiconductor memory device, especially a DRAM.

Figure 19:
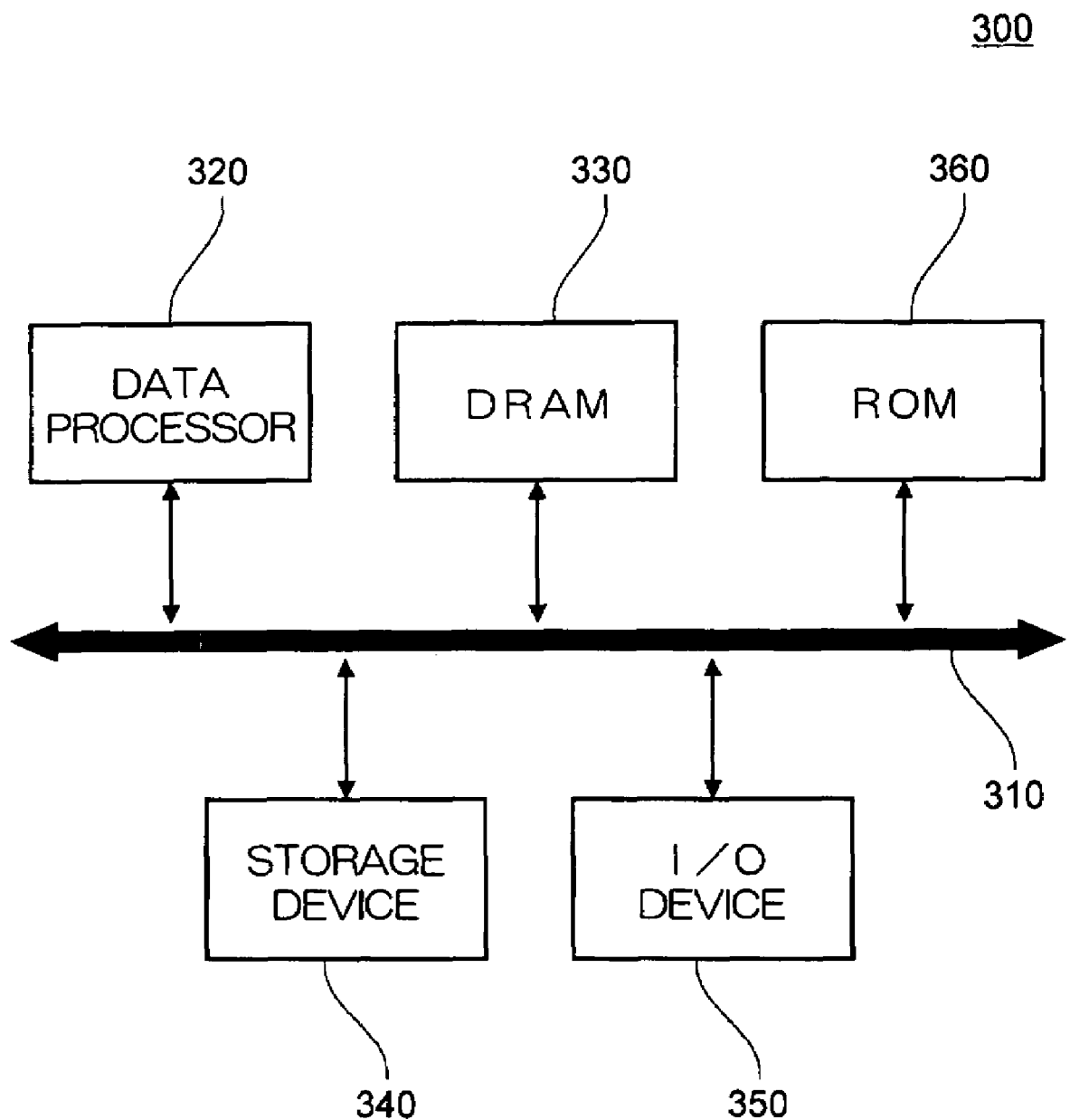
FIG. 19 is a block diagram showing a data processing system using the semiconductor memory device.

FIG. 19 is a block diagram showing a data processing system using the DRAM that the present invention is applied.

The data processing system 300 shown in FIG. 19 includes a data processor 320 and a DRAM 330 that the present invention is applied are connected to each other via a system bus 310. The data processor 320 can be selected from at least a microprocessor (MPU) and a digital signal processor (DSP). In FIG. 19, although the data processor 320 and the DRAM 330 are connected via the system bus 310 in order to simplify the diagram, they can be connected via not the system bus 310 but a local bus.

Further, in FIG. 19, although only one set of system bus 310 is employed in the data processing system 300 in order to simplify the diagram, a serial bus or a parallel bus connected to the system bus 310 via connectors can be provided. As shown in FIG. 19, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device can include either input or output device. Further, although each one element is provided as shown in FIG. 19, two or more same elements can be provided in the data processing system.

The present invention is in no way limited to the aforementioned embodiments, but rather various modifications are possible within the scope of the invention as recited in the claims, and naturally these modifications are included within the scope of the invention.

Figure 13:
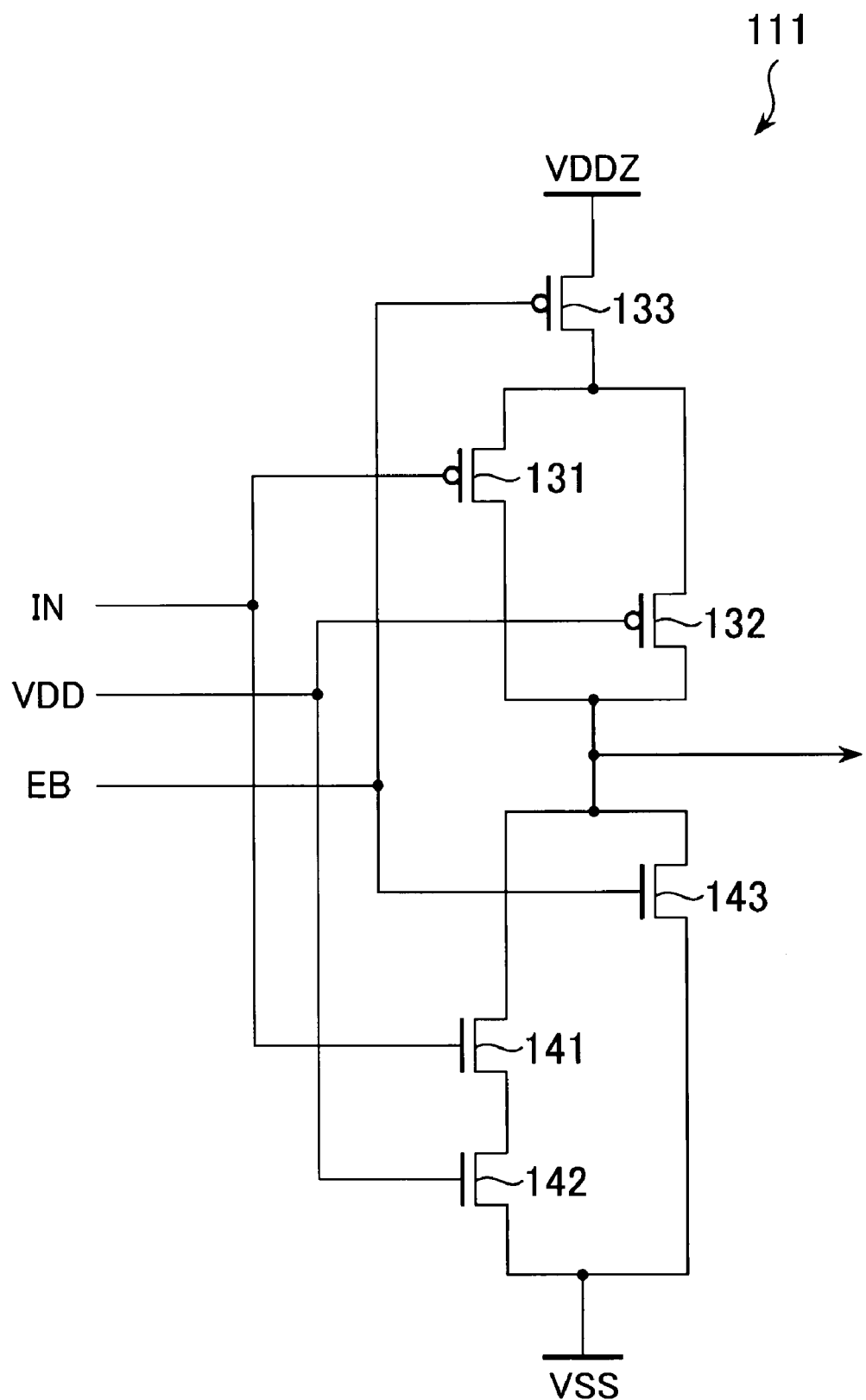
FIG. 13 is a circuit diagram showing a modification of the first AND-NOR composite gate shown in FIG. 2.

For example, the circuit configuration of the composite gate in the present invention is not particularly limited. A composite gate circuit having a circuit configuration different from the circuit used in the above embodiments can be used. Accordingly, instead of the AND-NOR composite gate 111 shown in FIG. 2, the AND-NOR composite gate 111 shown in FIG. 13 can be used. The AND-NOR composite gate 111 shown in FIG. 13 has a configuration such that a position of a parallel circuit formed of the P-channel MOS transistors 131 and 132 is replaced by a position of the P-channel MOS transistor 133. Needless to say, such replacement can also be possible in the AND-NOR composite gate 121 shown in FIG. 3.

Figure 14:
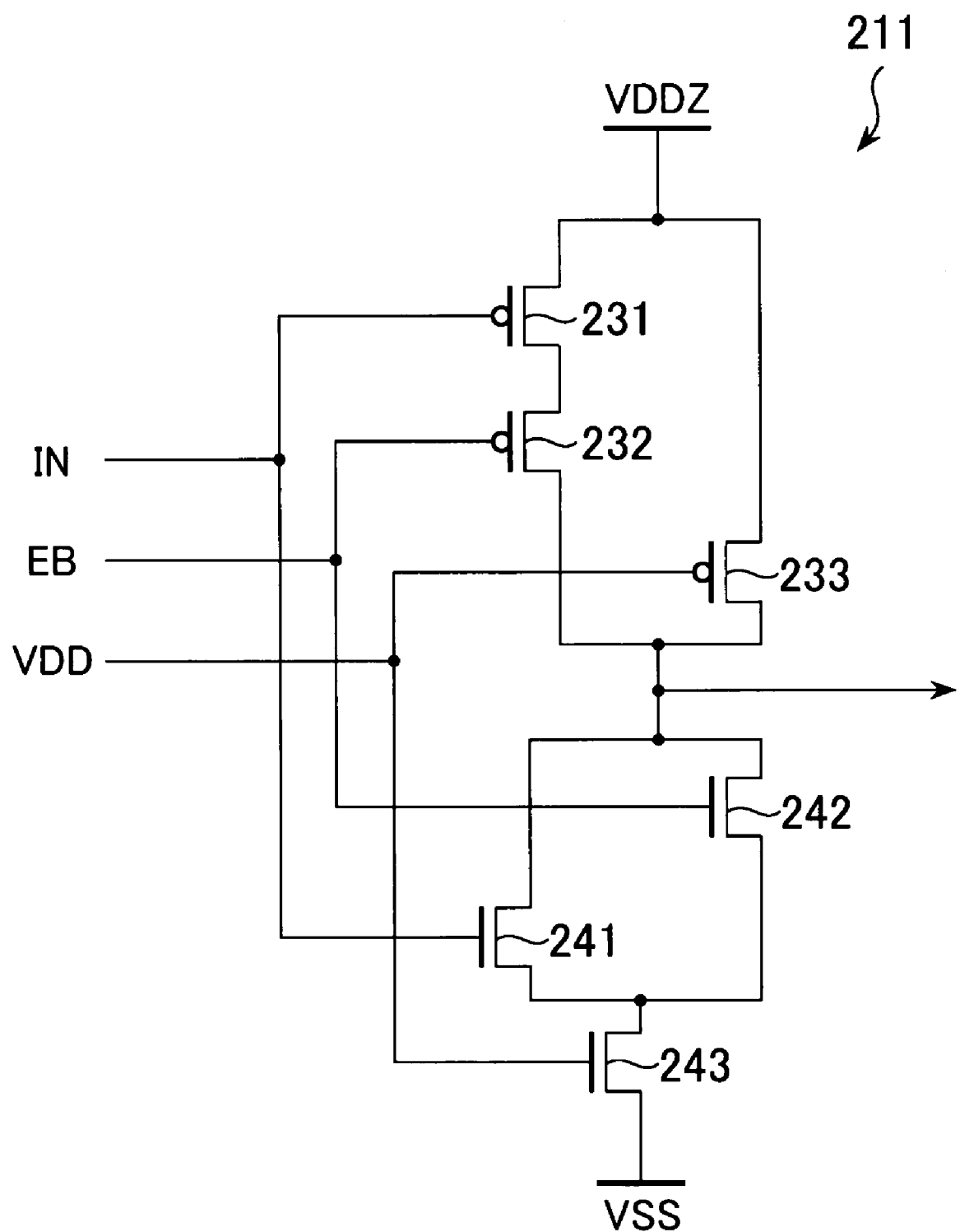
FIG. 14 is a circuit diagram showing a modification of the first OR-NAND composite gate shown in FIG. 5.
Figure 15:
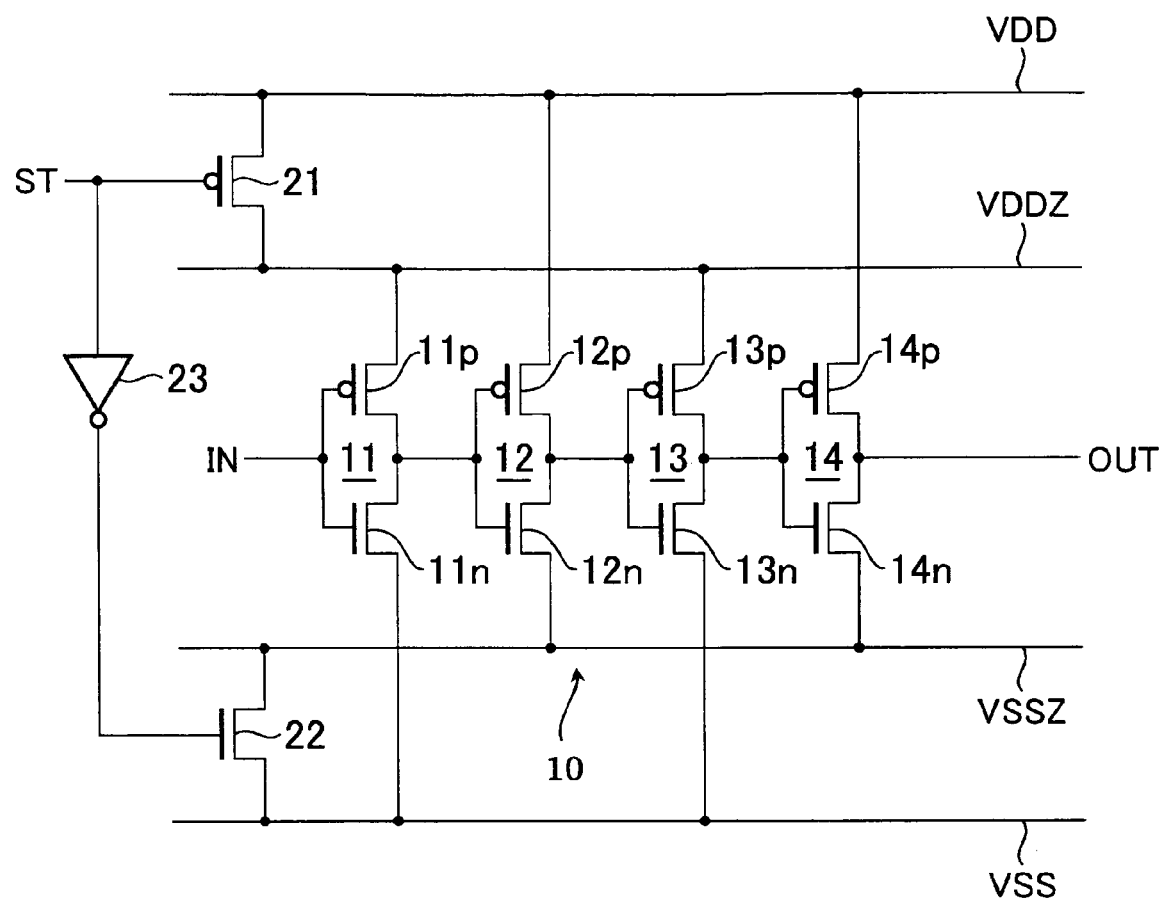
FIG. 15 is a circuit diagram of a general semiconductor device using a pseudo power supply wiring.
Figure 16:
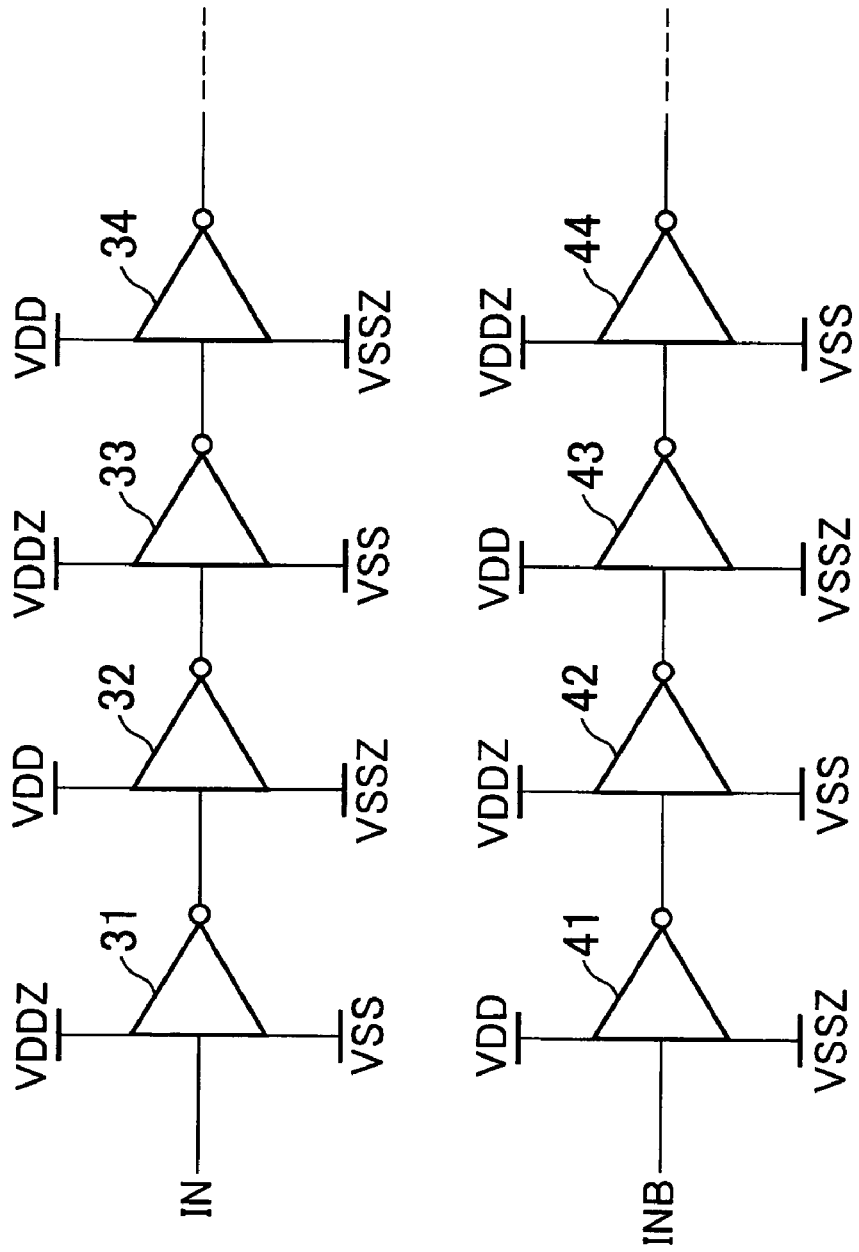
FIG. 16 is a circuit diagram for explaining a method of connecting with the pseudo power supply wiring when the input signal is complementary.
Figure 17:
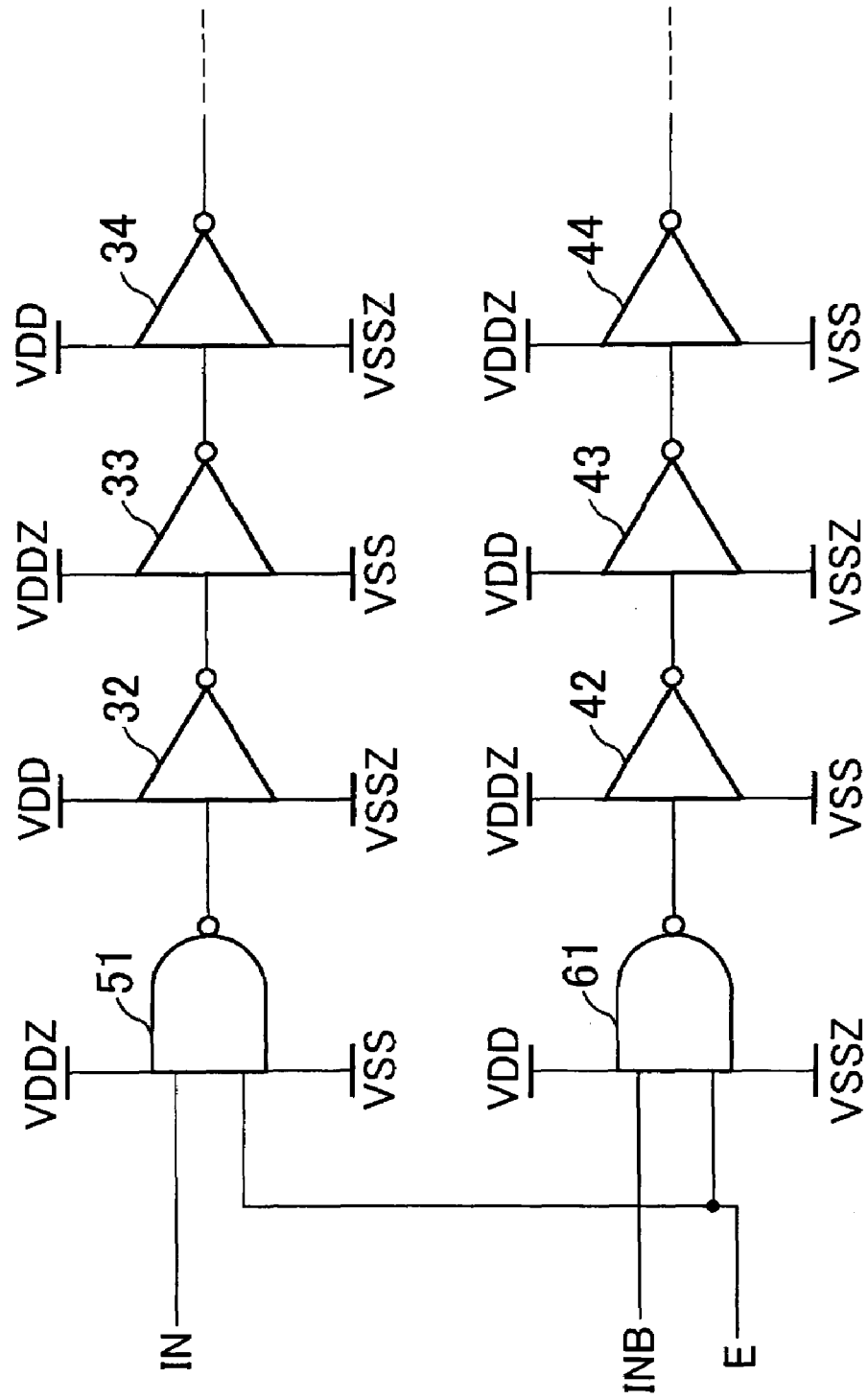
FIG. 17 is a circuit diagram showing an example in which the enable signal is supplied to a path through which the complementary input signal passes.
Figure 18:
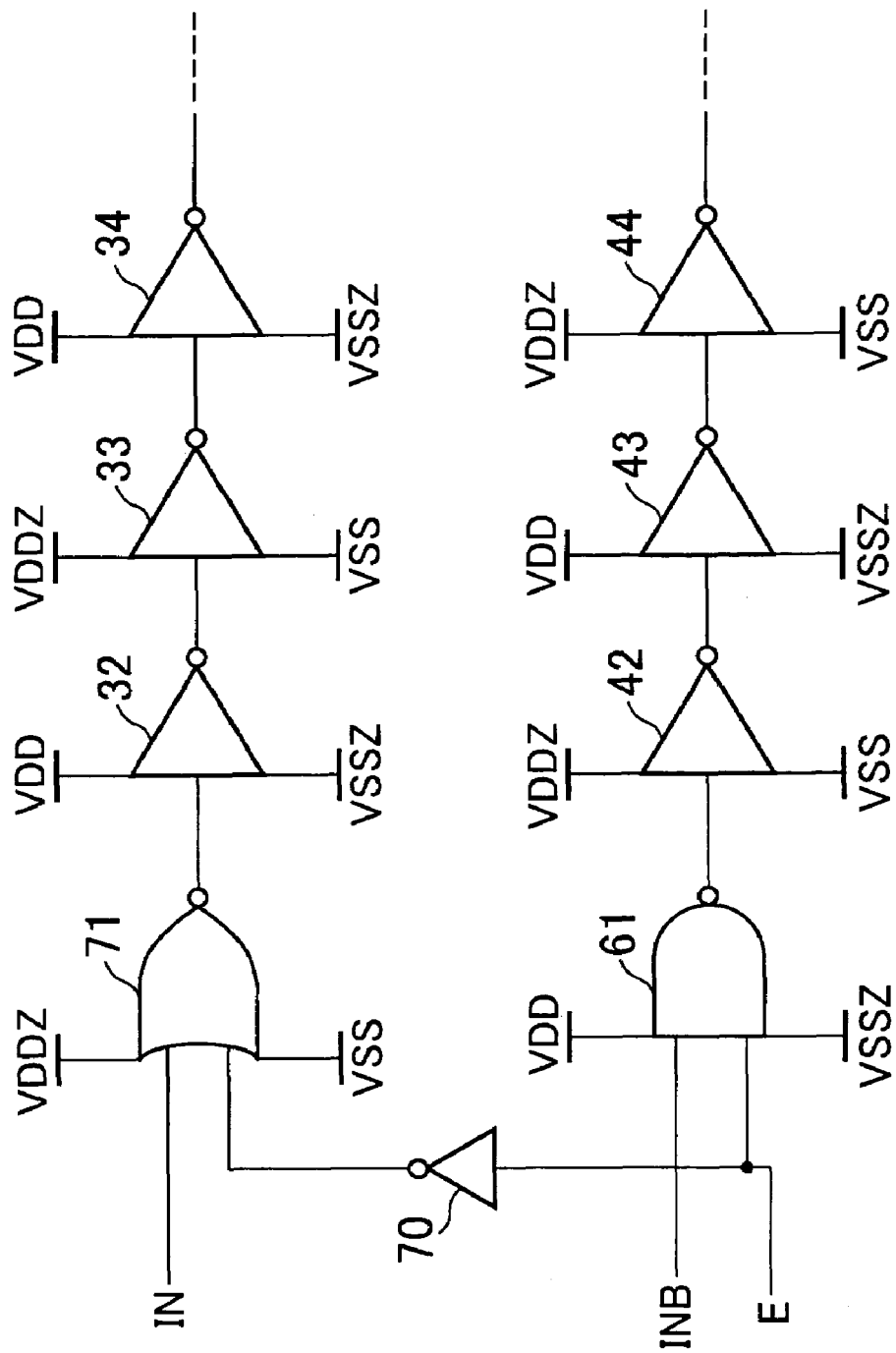
FIG. 18 is a circuit diagram showing an example in which the sub-threshold current is reduced by improving the circuit shown in FIG. 17.

Likewise, instead of the OR-NAND composite gate 211 shown in FIG. 5, an OR-NAND composite gate 211 shown in FIG. 14 can be used. The OR-NAND composite gate 211 shown in FIG. 14 has a configuration such that a position of a parallel circuit formed of the N-channel MOS transistors 241 and 242 is replaced by a position of the N-channel MOS transistor 243. Needless to say, such replacement can also be possible in the OR-NAND composite gate 221 shown in FIG. 6.

As described above, in the semiconductor device according to the present invention, the first and second gate circuits have the same configuration to each other. As a result, it becomes possible to retain a symmetric property of the complementary signal that passes through the first and second gate circuits. Further, outputs of the first and second gate circuits are fixed irrespective of a logical level of the enable signal. Thus, it is also possible to achieve inhibiting of a sub-threshold current.

What is claimed is:

1. A semiconductor device, comprising:
 a first gate circuit including a first logical unit having at least first and second input nodes, and a second logical unit receiving an output signal from the first logical unit and having at least a third input node; and a second gate circuit substantially having the same circuit configuration as the first gate circuit and having fourth to sixth input nodes each corresponding to the first to third input nodes, wherein the first and fourth input nodes are supplied with complementary input signals, the second and sixth input nodes are each supplied with predetermined power supply potentials, the third and fifth input nodes are supplied with enable signal, and one of a pair of power supply terminals included in the first and second gate circuits being connected to a main power supply wiring and the other of the pair of power supply terminals being connected to a pseudo power supply wiring.

2. The semiconductor device as claimed in claim 1, wherein one of the first and second logical units is an AND-based logical unit and the other thereof is an OR-based logical unit, and the enable signals supplied to the third and fifth input nodes are complementary signals.

3. The semiconductor device as claimed in claim 2, wherein the second and sixth input nodes are each supplied with power supply potentials indicating one logical level and the other logical level.

4. The semiconductor device as claimed in claim 3, wherein the first and second gate circuits are configured of an AND-NOR composite gate, the first logical unit is the AND-based logical unit, the second logical unit is the OR-based logical unit, the second input node is supplied with a power supply potential indicating a high level, and the sixth input node is supplied with a power supply potential indicating a low level.

5. The semiconductor device as claimed in claim 3, wherein the first and second gate circuits are configured of an OR-NAND composite gate, the first logical unit is the OR-based logical unit, the second logical unit is the AND-based logical unit, the second input node is supplied with a power supply potential indicating a low level, and the sixth input node is supplied with a power supply potential indicating a high level.

6. The semiconductor device as claimed in claim 4, wherein one of the pair of power supply terminals included in the first gate circuits is connected to the main power supply wiring supplying the potential indicating the high level, the other of the pair of power supply terminals included in the first gate circuits is connected to the pseudo power supply wiring supplying the potential indicating the low level, one of the pair of power supply terminals included in the second gate circuits is connected to the main power supply wiring supplying the potential indicating the low level, and the other of the pair of power supply terminals included in the second gate circuits is connected to the pseudo power supply wiring supplying the potential indicating the high level.

7. The semiconductor device as claimed in claim 5, wherein one of the pair of power supply terminals included in the first gate circuits is connected to the main power supply wiring supplying the potential indicating the high level, the other of the pair of power supply terminals included in the first gate circuits is connected to the pseudo power supply wiring supplying the potential indicating the low level, one of the pair of power supply terminals included in the second gate circuits is connected to the main power supply wiring supplying the potential indicating the low level, and the other of the pair of power supply terminals included in the second gate circuits is connected to the pseudo power supply wiring supplying the potential indicating the high level.

8. The semiconductor device as claimed in claim 1, wherein both of the first and second logical units are AND-based circuits or OR-based circuits, and the enable signals supplied to the third and fifth input nodes are the same signals.

9. The semiconductor device as claimed in claim 8, wherein both of the second and sixth input nodes are supplied with power supply potentials indicating one of logical levels.

10. The semiconductor device as claimed in claim 9, wherein both of the first and second logical units are NAND circuits, and both of the second and sixth input nodes are supplied with power supply potentials indicating a high level.

11. The semiconductor device as claimed in claim 9, wherein both of the first and second logical units are NOR circuits, and both of the second and sixth input nodes are supplied with power supply potentials indicating a low level.

12. A semiconductor device, comprising:

first and second composite gates having an AND-based logical unit and an OR-based logical unit;

a high-order main power supply wiring to which a high-order power supply potential is supplied;

a high-order pseudo power supply wiring connected to the high-order main power supply wiring in an active state and disconnected from the high-order main power supply wiring in a standby state;

a low-order main power supply wiring to which a low-order power supply potential is supplied; and a low-order pseudo power supply wiring connected to the low-order main power supply wiring in the active state and disconnected from the low-order main power supply wiring in the standby state, wherein a pair of power supply terminals of the first composite gate have one of the terminals being connected to the high-order main power supply wiring and the other one of the terminals being connected to the low-order pseudo power supply wiring, a pair of power supply terminals of the second composite gate have one of the terminals being connected to the high-order pseudo power supply wiring and the other one of the terminals being connected to the low-order main power supply wiring, the AND-based logical unit of the first composite gate is fixedly supplied with a high level, the OR-based logical unit of the second composite gate is fixedly supplied with a low level, the OR-based logical unit of the first composite gate is supplied with an enable signal, the AND-based logical unit of the second composite gate is supplied with an inverted signal of the enable signal, one of the AND-based logical unit and the OR-based logical unit of the first composite gate is supplied with an input signal of which logical level is changed in the active state and is fixed in the standby state, and one of the AND-based logical unit and the OR-based logical unit of the second composite gate is supplied with an inverted signal of the input signal.

13. The semiconductor device as claimed in claim 12, wherein both the first and second gates are AND-NOR composite gates, the AND-based logical unit of the first composite gate is supplied with the input signal, and the AND-based logical unit of the second composite gate is supplied with the inverted signal of the input signal.

14. The semiconductor device as claimed in claim 12, wherein both the first and second composite gates are OR-NAND composite gates, the OR-based logical unit of the first composite gate is supplied with the input signal, and the OR-based logical unit of the second composite gate is supplied with the inverted signal of the input signal.

15. A data processing system comprising a data processor and a semiconductor memory device, wherein the semiconductor memory device includes:

a first gate circuit including a first logical unit having at least first and second input nodes, and a second logical unit receiving an output signal from the first logical unit and having at least a third input node; and a second gate circuit substantially having the same circuit configuration as the first gate circuit and having fourth to sixth input nodes each corresponding to the first to third input nodes, wherein the first and fourth input nodes are supplied with complementary input signals, the second and sixth input nodes are each supplied with predetermined power supply potentials, the third and fifth input nodes are supplied with enable signal, and one of a pair of power supply terminals included in the first and second gate circuits being connected to a main power supply wiring and the other of the pair of power supply terminals being connected to a pseudo power supply wiring.

16. A semiconductor device comprising:

first and second power supply lines supplied respectively with first and second power voltages;

first and second pseudo power lines;

the first power supply line and the first pseudo power line being connected to one another in an active state of said device and disconnected from one another in a standby state of said device, and the second power supply line and the second pseudo power line being connected to one another in an active state of said device and disconnected from one another in a standby state of said device;

a first input node supplied with a first input signal;

a second input node supplied with a second input signal, the second input signal being opposite in phase to the first input signal;

a third input node supplied with a third input signal;

a fourth input node supplied with a fourth input signal, the fourth input signal being opposite in phase to the third input signal;

a first gate circuit having a first power node coupled to one of the first pseudo power line and the second power supply line, a second power node coupled to one of the second power supply line and the first pseudo power line, a first output node, a first parallel coupling circuit of third and fourth transistors, a fifth transistor coupled between the first power node and the first output node in series with the first parallel coupling circuit, a first series coupling circuit of sixth and seventh transistors, and an eighth transistor coupled between the first output node and the second power node in parallel to the first series coupling circuit, each of the third and sixth transistors having a control electrode coupled to the first input node, each of the fourth and seventh transistors having a control electrode coupled to the first power supply line, and each of the fifth and eighth transistors having a control electrode coupled to the fourth input node; and a second gate circuit having a third power node coupled to one of the first power supply and the second pseudo power line, a fourth power node coupled to one of the second pseudo power line and the first power supply line, a second output node, a second parallel coupling circuit of ninth and tenth transistors, an eleventh transistor coupled between the third power node and the second output node in series with the second parallel coupling circuit, a second series coupling circuit of twelfth and thirteenth transistors, and a fourteenth transistor coupled between the second output node and the fourth power node in parallel to the first series coupling circuit, each of the ninth and twelfth transistors having a control electrode coupled to the second input node, each of the tenth and thirteenth transistors having a control electrode coupled to the third input node, and each of the eleventh and fourteenth transistors having a control electrode coupled to the second power supply line.

17. The device as claimed in claim 16, further comprising:

a first inverter circuit having a third input node coupled to the first output node, a fifth power node coupled to the first power supply line, and a sixth power node coupled to the second pseudo power line; and a second inverter circuit having a fourth input node coupled to the second output node, a seventh power node coupled to the first pseudo power line, and an eighth power node coupled to the second power supply line.

18. The device as claimed in claim 16, wherein each of the third, fourth, fifth, ninth, tenth and eleventh transistors is an MOS transistor of a first channel type and each of the sixth, seventh, eighth, twelfth, thirteenth and fourteenth transistors is an MOS transistor of a second channel type.

19. The device as claimed in claim 16, wherein each of the first and second control signals takes an active level to render each of the first and second transistors conductive in an operation mode and an inactive level to render each of the first and second transistors nonconductive in a standby mode.

* * * * *